(12) United States Patent
Shimomoto et al.

(10) Patent No.: US 9,059,680 B2
(45) Date of Patent: Jun. 16, 2015

(54) IMPEDANCE ADJUSTING APPARATUS

(71) Applicant: DAIHEN Corporation, Osaka-shi, Osaka (JP)

(72) Inventors: Takashi Shimomoto, Osaka (JP); Koji Itadani, Osaka (JP); Masakatsu Mito, Osaka (JP)

(73) Assignee: DAIHEN CORPORATION, Osaka (JP)

( * ) Notice: Subject to any disclaimer, the term of this patent is extended or adjusted under 35 U.S.C. 154(b) by 22 days.

(21) Appl. No.: 14/012,354

(22) Filed: Aug. 28, 2013

(65) Prior Publication Data

US 2014/0091875 A1 Apr. 3, 2014

(30) Foreign Application Priority Data

Sep. 28, 2012 (JP) .................................. 2012-218702

(51) Int. Cl.
*H03H 7/40* (2006.01)

(52) U.S. Cl.
CPC ........................................ *H03H 7/40* (2013.01)

(58) Field of Classification Search
CPC ........................................................ H03H 7/40
USPC ........... 333/17.3, 124, 32; 343/822, 852, 860, 343/861; 326/30; 367/152
See application file for complete search history.

(56) References Cited

U.S. PATENT DOCUMENTS

| 7,292,047 | B2 * | 11/2007 | Tanaka et al. ................. 324/600 |
| 7,332,981 | B2 | 2/2008 | Matsuno |
| 7,489,206 | B2 | 2/2009 | Kotani et al. |
| 7,642,879 | B2 * | 1/2010 | Matsuno ...................... 333/17.3 |
| 2003/0184319 | A1 * | 10/2003 | Nishimori et al. ............ 324/684 |

FOREIGN PATENT DOCUMENTS

| JP | 2006-166412 | 6/2006 |
| JP | 2006-310245 | 11/2006 |
| JP | 2008-181846 | 8/2008 |

* cited by examiner

*Primary Examiner* — Jung Kim
(74) *Attorney, Agent, or Firm* — Hamre, Schumann, Mueller & Larson, P.C.

(57) ABSTRACT

An impedance adjustment apparatus of the invention performs impedance matching using characteristic parameters, even where a high frequency power source of variable frequencies is used. The apparatus is applicable to a power supply system using a high frequency power source of variable frequencies. Characteristic parameters obtained by targeting a portion of combinations of position information (C) of a variable capacitor and output frequency information (F) of the power source are stored in a memory. A T-parameter acquisition unit acquires characteristic parameters corresponding to $(C_{now}, F_{now})$ at the current time. An output reflection coefficient calculation unit calculates a reflection coefficient of an output end. A target information specifying unit, based on the above information and a target input reflection coefficient, specifies target combination information in which a reflection coefficient of an output end approaches the target input reflection coefficient. Impedance matching is performed based on this information.

10 Claims, 10 Drawing Sheets

IMPEDANCE ADJUSTING APPARATUS

BACKGROUND OF THE INVENTION

1. Field of the Invention

The present invention relates to an impedance adjustment apparatus that is provided between a high frequency power source and a load, and that adjusts impedance seen from the high frequency power source to the load side.

2. Description of Related Art

FIG. 8 is a diagram showing an exemplary configuration of a high frequency power supply system. This high frequency power supply system is a system for performing a processing process such as plasma etching or plasma CVD on a workpiece such as a semiconductor wafer or a liquid crystal substrate, for example. The high frequency power supply system is constituted by a high frequency power source 1, a transmission line 2, an impedance adjustment apparatus 3, a load connecting portion 4, and a load 5 (plasma processing apparatus 5). The impedance adjustment apparatus may also be called an impedance matching apparatus. The high frequency power source 1 supplies high frequency power to the load 5 via the transmission line 2, the impedance adjustment apparatus 3, and the load connecting portion 4. In the load 5 (plasma processing apparatus 5), a plasma discharge gas is changed into a plasma state within a chamber (not shown) in which the workpiece is disposed, and the workpiece is processed using the gas that is in the plasma state. The gas in the plasma state is generated by introducing the plasma discharge gas into the chamber and supplying high frequency power from the high frequency power source 1 to an electrode (not shown) provided within the chamber to cause the plasma discharge gas to discharge.

With a plasma processing apparatus 5 that is used for applications such as plasma etching and plasma CVD, the state of the plasma constantly changes with the progress of the manufacturing process. The changing state of the plasma results in the impedance (load impedance) of the plasma processing apparatus 5 constantly changing. In order to efficiently supply power from the high frequency power source 1 to such a plasma processing apparatus 5, an impedance ZL seen from an output end of the high frequency power source 1 to the plasma processing apparatus 5 side (hereinafter, load-side impedance ZL) needs to be adjusted following a change in load impedance. For this reason, with the high frequency power supply system shown in FIG. 8, the impedance adjustment apparatus 3 is interposed between the high frequency power source 1 and the load 5 (plasma processing apparatus 5).

The impedance adjustment apparatus 3 is provided with elements having variable electrical characteristics such as variable capacitors or variable inductors. Variable capacitors are capacitors whose capacitance can be changed. The impedance adjustment apparatus 3 adjusts the load-side impedance ZL by adjusting electrical characteristics such as capacitance or inductance of the elements having variable electrical characteristics. The impedance adjustment apparatus 3 matches the output impedance of the high frequency power source 1 and the impedance of the load 5, by setting the electrical characteristics of the elements having variable electrical characteristics to suitable values. Matching the impedances enables the power supplied to the load 5 to be maximized by minimizing reflected wave power directed from the load 5 to the high frequency power source 1 as much as possible.

Because variable capacitors and variable inductors are elements whose electrical characteristics can be adjusted, in the present specification, variable capacitors and variable inductors are collectively referred to as "elements having variable electrical characteristics". Also, information on capacitance, inductance and the like is referred to as "electrical characteristic information".

FIG. 9 is a block diagram showing an exemplary configuration of a high frequency power supply system including a conventional impedance adjustment apparatus 3P.

A high frequency power source 1p is connected to an input end 301 of the impedance adjustment apparatus 3P by a transmission line 2, and a load 5 (plasma processing apparatus) is connected to an output end 302 by a load connecting portion 4. The high frequency power source 1p is a power source that outputs a high frequency wave having a constant output frequency. The output frequency is a fundamental frequency (frequency of a fundamental wave) of the high frequency wave that is output from the high frequency power source 1p.

As shown in FIG. 9, the impedance adjustment apparatus 3P is provided with an adjustment circuit 20p constituted by a first variable capacitor 21, a second variable capacitor 24, and an inductor 23. The first variable capacitor 21 and the second variable capacitor 24 are one type of element having variable electrical characteristics. An output end of the adjustment circuit 20p is connected to the output end 302 of the impedance adjustment apparatus 3P, and a directional coupler 10 is provided between an input end of the adjustment circuit 20p and the input end 301 of the impedance adjustment apparatus 3P.

The high frequency power output from the high frequency power source 1p is supplied to the load 5 via the directional coupler 10 and the adjustment circuit 20p provided in the impedance adjustment apparatus 3P. Note that high frequency power that is output from the high frequency power source 1p and travels to the load 5 is called traveling wave power PF, and high frequency power that is reflected by the load 5 and returns to the high frequency power source 1p is called reflected wave power PR.

The impedance adjustment apparatus 3P is able to adjust (change) the load-side impedance ZL, by adjusting (changing) the capacitances of the first variable capacitor 21 and the second variable capacitor 24 provided in the adjustment circuit 20p. The impedance adjustment apparatus 3P matches the output impedance of the high frequency power source 1p and the impedance of the load 5, by changing the respective capacitances of the first variable capacitor 21 and the second variable capacitor 24 to suitable values. Note that the configuration of the adjustment circuit 20p differs depending on factors such as the output frequency of the high frequency power source 1p and conditions of the load 5. Variable inductors may be also used as elements having variable electrical characteristics.

The variable capacitors use for the first variable capacitor 21 and second variable capacitor 24 have a movable portion (not shown) for adjusting capacitance. The capacitance of the variable capacitors is adjusted by displacing the position of the movable portion using a motor or the like.

The variable capacitors are provided with a pair of electrodes, at least one of which is a movable electrode, with the movable electrode being the movable portion for adjusting capacitance. Because the size of the opposing area of the movable electrode and the other electrode changes when the position of the movable electrode is displaced, resulting in a change in capacitance, the capacitance of the variable capacitor is adjusted (changed) by adjusting (changing) the position of the movable electrode.

The capacitance of the variable capacitor is configured so as to be adjustable over a plurality steps. The capacitance relative to the position of the movable portion of the variable capacitor is known through the specifications of the variable capacitor or through testing. Because the capacitances of the variable capacitors are known if the position of the movable portion is known, position information of the movable portion is used as information representing the capacitances (capacitance information) in adjusting the capacitances of the variable capacitors. Accordingly, the position information of the movable portion of the variable capacitors is treated as information representing electrical characteristics of the variable capacitors (electrical characteristic information).

The position information of the movable portion of the variable capacitors may be any information obtained by directly or indirectly detecting the position of the movable portion. Because it is difficult given the structure of the movable portion to directly detect the position of the movable portion, the position of the movable portion is indirectly detected by, for example, detecting the rotation position (amount of rotation) of the motor that displaces the position of the movable portion. The rotation position of the motor can be detected using a pulse signal or voltage that controls the drive of the motor, or the like.

In the case of FIG. 9, the position of the movable portion of the first variable capacitor 21 is adjusted by an adjustment unit 30, and the position information of the movable portion of the first variable capacitor 21 is detected (acquired) by a position detection unit 40. Also, the position of the movable portion of the second variable capacitor 24 is adjusted by an adjustment unit 50, and the position information of the movable portion of the second variable capacitor 24 is detected (acquired) by a detection unit 60.

The adjustment unit 30 is a drive means for displacing the position of the movable portion of the first variable capacitor 21. The adjustment unit 30 is constituted by a stepping motor, a motor drive circuit and the like (all not shown), for example. The motor drive circuit provided in the adjustment unit 30 rotates the stepping motor based on a command signal that is input from a control unit 100$p$. The position of the movable portion of the first variable capacitor 21 is displaced by the rotation of the stepping motor. Accordingly, the control unit 100$p$ adjusts the capacitance of the first variable capacitor 21 by controlling the amount of rotation of the stepping motor provided in the adjustment unit 30. Similarly, the adjustment unit 50 is a drive means for displacing the position of the movable portion of the second variable capacitor 24. The adjustment unit 50 is constituted by a stepping motor, a motor drive circuit, and the like (all not shown), for example. The motor drive circuit provided in the adjustment unit 50 rotates the stepping motor based on a command signal that is input from the control unit 100$p$, and displaces the position of the movable portion of the second variable capacitor 24. Accordingly, the control unit 100$p$ adjusts the capacitance of the second variable capacitor 24 by controlling the amount of rotation of the stepping motor provided in the adjustment unit 50.

The position detection unit 40 detects the rotation position (amount of rotation) of the stepping motor provided in the adjustment unit 30. Similarly, the position detection unit 60 detects the rotation position (amount of rotation) of the stepping motor provided in the adjustment unit 50.

Note that variable inductors differ in structure from the variable capacitors, but also have a movable portion, similarly to the variable capacitors. The variable inductors are also similarly configured to be able to adjust (change) the inductance of the variable inductors by displacing the position of the movable portion using a motor or the like. Because the method used by the variable inductors to vary the inductance is basically the same as the variable capacitors, description thereof will be omitted. Because the inductances are also similarly known if the position of the movable portion of the variable inductors is known, in the case where the variable inductors are used as the elements having variable electrical characteristics, position information of the movable portion of the variable inductors is treated as information representing the inductances of the variable inductors (inductance information).

The first variable capacitor 21 and second variable capacitor 24 are configured to be able to adjust respective capacitances over a plurality of steps. For example, in the case where the position of the movable portion of the first variable capacitor 21 and the second variable capacitor 24 can each be displaced over 101 steps, the impedance of the adjustment circuit 20$p$ can be changed in (101×101=) 10,201 (approx. ten thousand) combinations. That is, the impedance matching apparatus 3P is able to adjust (change) the load-side impedance ZL using approximately 10,000 impedance adjustment positions.

In the case where the position of the movable portion of the variable capacitors is displaced over a plurality of steps, allocating a number to each displacement position of the movable portion enables these numbers to be used as position information of the movable portion of the variable capacitors. For example, in the case where the position of the movable portion of the variable capacitors is displaced over 101 steps, assuming that the position at which the capacitance is minimized is "0" and the position at which the capacitance is maximized is "100", the position information of the movable portion of the variable capacitor is represented by the numbers 0 to 100. Accordingly, assuming that the position information of the movable portion of the first variable capacitor 21 and the position information of the movable portion of the second variable capacitor 24 are each represented by the numbers 0 to 100, the impedance adjustment position of the impedance adjustment apparatus 3P is represented by position information that combines the position information of the movable portion of the first variable capacitor 21 and the position information of the movable portion of the second variable capacitor 24, such as (0,0), (0,1), . . . , (100,100).

For example, Patent Document 1 (JP 2006-166412A) proposes an impedance adjustment apparatus 3P that performs impedance matching by controlling elements having variable electrical characteristics such as variable capacitors or variable inductors.

With the impedance adjustment apparatus 3P disclosed in Patent Document 1, characteristic parameters of the impedance adjustment apparatus 3P that have been measured in advance are stored in a memory 70$p$. The characteristic parameters are parameters indicating transmission characteristics in the case where the entire impedance adjustment apparatus 3P is regarded as a transmission apparatus, and include, for example, S-parameters (scattering parameters) and T-parameters (transmission parameters) converted from the S-parameters. The characteristic parameters are measured with respect to all impedance adjustment positions of the impedance adjustment apparatus 3P (position information combining the position information of the movable portion of the first variable capacitor 21 and the position information of the movable portion of the second variable capacitor 24), after adjusting the impedance adjustment apparatus 3P to the respective impedance adjustment positions. Accordingly, the measured values of a plurality of characteristic parameters are stored in the memory 70$p$ in association with the impedance adjustment positions. The control unit 100$p$ then performs impedance matching, based on a detection signal of a traveling wave voltage and a detection signal of a reflected wave voltage that are output from the directional coupler 10, position information of the movable portion of the first variable capacitor 21 that is detected by the position detection unit 40, position information of the movable portion of the second variable capacitor 24 that is detected by the position detection unit 60, and information on the characteristic parameters stored in the memory 70p.

Because the characteristic parameters are parameters indicating transmission characteristics within the impedance adjustment apparatus 3p including stray capacitance and inductance components, accurate impedance matching can be performed if impedance matching is performed using the measured characteristic parameters. PGP-2[1].

TABLE 1

|     |     | VC1 | | | | | | |
| --- | --- | --- | --- | --- | --- | --- | --- | --- |
|     |     | 0 | 1 | 2 | ... ... | 98 | 99 | 100 |
| VC2 | 0   | T (0, 0) | T (1, 0) | T (2, 0) | ... ... | T (98, 0) | T (99, 0) | T (100, 0) |
|     | 1   | T (0, 1) | T (1, 1) | T (2, 1) | ... ... | T (98, 1) | T (99, 1) | T (100, 1) |
|     | 2   | T (0, 2) | T (1, 2) | T (2, 2) | ... ... | T (98, 2) | T (99, 2) | T (100, 2) |
|     | ... | ... | ... | ... | ... ... | ... | ... | ... |
|     | ... | ... | ... | ... | ... ... | ... | ... | ... |
|     | 98  | T (0, 98) | T (1, 98) | T (2, 98) | ... ... | T (98, 98) | T (99, 98) | T (100, 98) |
|     | 99  | T (0, 99) | T (1, 99) | T (2, 99) | ... ... | T (98, 99) | T (99, 99) | T (100, 99) |
|     | 100 | T (0, 100) | T (1, 100) | T (2, 100) | ... ... | T (98, 100) | T (99, 100) | T (100, 100) |

Table 1 is an example of characteristic parameters stored in the memory 70p. Table 1 shows an example of the case where the characteristic parameters stored in the memory 70p are T-parameters. In Table 1, the position information of the movable portion of the first variable capacitor 21 is represented with a variable VC1, and the position information of the movable portion of the second variable capacitor 24 is represented with a variable VC2. Also, the variable range of the movable portion of the first variable capacitor 21 and the variable range of the movable portion of the second variable capacitor 24 are respectively ranges of 0 to 100 (101 steps).

In Table 1, T(0,0) indicates the T-parameter measured after adjusting the impedance adjustment apparatus 3P to an impedance adjustment position (0,0) (adjustment position at which the position information of the movable portion of the first variable capacitor 21 is "0", and the position information of the movable portion of the second variable capacitor 24 is "0"). Similarly, T(100,0) indicates the T-parameter measured after adjusting the impedance adjustment apparatus 3P to an impedance adjustment position (100,0) (adjustment position at which the position information of the movable portion of the first variable capacitor 21 is "100", and the position information of the movable portion of the second variable capacitor 24 is "0"). Other T-parameters are displayed with a similar approach. Note that although T-parameters are measured for all 10201 impedance adjustment positions of the impedance adjustment apparatus 3P, some of those values have been abbreviated as " . . . " in Table 1 in order to simplify the description.

Here, the S-parameters and the T-parameters will be described.

The S-parameters are parameters indicating the transmission characteristics of a prescribed four-terminal network (also known as a "two-port network") at the time when a high frequency signal is input after connecting lines having characteristic impedance (e.g., 50Ω) to input and output terminals of the four-terminal network as is well known. The S-parameters are, as shown in Equation 1, represented as a matrix that is constituted by elements consisting of an input-side voltage reflection coefficient ($S_{11}$), a transmission coefficient ($S_{21}$) of a forward voltage, a transmission coefficient ($S_{12}$) of a reverse voltage, and an output-side voltage reflection coefficient ($S_{22}$).

$$\begin{bmatrix} S_{11} & S_{12} \\ S_{21} & S_{22} \end{bmatrix} \quad \langle \text{Equation 1} \rangle$$

The T-parameters are, as shown in Equation 2, parameters that can be converted from the S-parameters. In measuring the transmission characteristics of a four-terminal network, the S-parameters are generally simple to measure, but the T-parameters are simple to use when performing calculations.

$$\frac{1}{S_{12}} \begin{bmatrix} S_{12} \cdot S_{21} - S_{11} \cdot S_{22} & S_{22} \\ -S_{11} & 1 \end{bmatrix} \rightarrow \begin{bmatrix} T_{11} & T_{12} \\ T_{21} & T_{22} \end{bmatrix} \quad \langle \text{Equation 2} \rangle$$

In the four-terminal network shown in FIG. 10, the S-parameters are defined as in Equation 3 and the T-parameters are as defined as in Equation 4.

$$\begin{bmatrix} b_1 \\ b_2 \end{bmatrix} = \begin{bmatrix} S_{11} & S_{12} \\ S_{21} & S_{22} \end{bmatrix} \begin{bmatrix} a_1 \\ a_2 \end{bmatrix} \quad \langle \text{Equation 3} \rangle$$

$$\begin{bmatrix} b_2 \\ a_2 \end{bmatrix} = \begin{bmatrix} T_{11} & T_{12} \\ T_{21} & T_{22} \end{bmatrix} \begin{bmatrix} a_1 \\ b_1 \end{bmatrix} \quad \langle \text{Equation 4} \rangle$$

In FIG. 10, the relationship between an input reflection coefficient Γin (input-end reflection coefficient) and an output reflection coefficient Γout (output-end reflection coefficient) when a port 1 is the input side and a port 2 is the load side can be represented using the S-parameters (see Eq. 5) or the T-parameters (see Eq. 6).

$$\Gamma\text{out} = \frac{a_2}{b_2} \quad \langle \text{Equation 5} \rangle$$

$$= \frac{\Gamma\text{in} - S_{11}}{S_{12} \cdot S_{21} + S_{22}(\Gamma\text{in} - S_{11})}$$

$$\Gamma\text{out} = \frac{a_2}{b_2} \quad \langle \text{Equation 6} \rangle$$

$$= \frac{T_{21} + T_{22} \cdot \Gamma\text{in}}{T_{11} + T_{12} \cdot \Gamma\text{in}}$$

As described above, in the high frequency power supply system shown in FIG. 9, the output frequency of the high frequency power source 1p is fixed to a certain constant frequency. However, for example, in Patent Document 2 (JP 2006-310245), technology is proposed for performing impedance matching while adjusting the output frequency of the high frequency power source, focusing on the change in the load-side impedance seen from the output end of the high frequency power source to the load side when the output frequency of the high frequency power source is changed. With the technology described in Patent Document 2, impedance matching is performed by changing the output frequency of the high frequency power source to change the load-side impedance, because the capacitance component and the inductance component that are included in the load-side impedance change depending on the frequency. Note that, in the present specification, a high frequency power source whose output frequency can be adjusted (changed) in this way is called a high frequency power source 1v employing a variable frequency system.

Also, even in the case where a high frequency power source 1v employing a variable frequency system is used, an impedance adjustment apparatus that includes an adjustment circuit 20 shown in FIG. 11 is used in some cases, as described in Patent Document 3 (JP 2008-181846). The adjustment circuit 20 is an adjustment circuit in which the second variable capacitor 24 is replaced by a capacitor 22 having a fixed capacitance in the adjustment circuit 20p shown in FIG. 9. With the impedance adjustment apparatus described in Patent Document 3, impedance matching is performed by adjusting the output frequency of the high frequency power source 1v together with adjusting the position of the movable portion of the first variable capacitor 21. Note that because the capacitance of the capacitor 22 of the adjustment circuit 20 is fixed, an adjustment unit for adjusting capacitance and a position detection unit for detecting position information of the movable portion are not provided.

With the impedance matching method described in Patent Document 1 that performs impedance matching using characteristic parameters measured in advance, because of the characteristic parameters being measured with respect to a single output frequency, cases occur where impedance matching cannot be performed when the impedance matching method described in Patent Document 1 is applied to the high frequency power supply system described in Patent Document 2 or Patent Document 3 while changing the output frequency of the high frequency power source 1v.

SUMMARY OF THE INVENTION

The present invention was conceived under the above circumstances. In view of this, the present invention has an object to provide an impedance adjustment apparatus that is able to perform impedance matching using characteristic parameters, even in the case where an output frequency is adjusted (changed) using a high frequency power source employing a variable frequency system.

An impedance adjustment apparatus provided based on an embodiment of the present invention is provided between a high frequency power source and a load, and is configured to adjust impedance seen from the high frequency power source to the load.

The impedance adjustment apparatus includes an input end for connecting to the high frequency power source, an output end for connecting to the load, and a variable electrical characteristic element. The impedance adjustment apparatus is further provided with a characteristic parameter storage unit for storing a plurality of characteristic parameters indicating transmission characteristics of the impedance adjustment apparatus, the plurality of characteristic parameters being parameters that are respectively acquired for a plurality of adjustment points at which a plurality of frequency adjustment points that correspond to output frequencies of the high frequency power source are combined with a plurality of electrical characteristic adjustment points that correspond to electrical characteristics of the variable electrical characteristic element; a high frequency information detection unit for detecting high frequency information of the input end; an output frequency acquisition unit for acquiring an output frequency of the high frequency power source; an electrical characteristic acquisition unit for acquiring an electrical characteristic of the variable electrical characteristic element; a characteristic parameter acquisition unit for acquiring a characteristic parameter for an adjustment point at which the acquired output frequency is combined with the acquired electrical characteristic, based on the plurality of characteristic parameters; an output reflection coefficient calculation unit for calculating an output reflection coefficient of the output end, based on the high frequency information detected by the high frequency information detection unit and the characteristic parameter acquired by the characteristic parameter acquisition unit; a specifying unit for specifying an impedance adjustment point at which to match the target impedance to the impedance of the high frequency power source, among the plurality of adjustment points, based on the output reflection coefficient, a target input reflection coefficient set in advance, and the plurality of characteristic parameters; an electrical characteristic element adjustment unit for adjusting the electrical characteristic of the variable electrical characteristic element to an electrical characteristic of the impedance adjustment point; and a command signal output unit for outputting, to the high frequency power source, a command signal for adjusting the output frequency of the high frequency power source to an output frequency of the impedance adjustment point.

Preferably, the characteristic parameter storage unit stores characteristic parameters measured for every adjustment point, or characteristic parameters that are converted from the measured characteristic parameters and are different in type from the measured characteristic parameters.

Preferably, the measured characteristic parameters are S-parameters and the characteristic parameters that are different in type from the measured characteristic parameters are T-parameters.

Preferably, the plurality of characteristic parameters that are stored in the characteristic parameter storage unit include actual values measured at each adjustment point with respect to a portion of the plurality of adjustment points, and estimated values computed at each adjustment point by interpolation using the actual values with respect to adjustment points that have not been measured among the plurality of adjustment points.

Preferably, the adjustment points at which the characteristic parameters were measured are adjustment points at which a portion of frequency adjustment points extracted at a first interval from the plurality of frequency adjustment points are combined with a portion of electrical characteristic adjustment points extracted at a second interval from the plurality of electrical characteristic adjustment points.

Preferably, the specifying unit, based on the target input reflection coefficient and the plurality of characteristic parameters, calculates a virtual output reflection coefficient of the output end at each adjustment point assuming that the output frequency of the high frequency power source and the electrical characteristic of the variable electrical characteristic element have been adjusted to the plurality of adjustment points, and specifies an adjustment point at which a difference between the output reflection coefficient and the virtual output reflection coefficient is smallest as an adjustment point of the target impedance.

Preferably, the high frequency information is a traveling wave voltage that travels from the high frequency power source to the load and a reflected wave voltage that is reflected from the load to the high frequency power source.

Preferably, the output reflection coefficient calculation unit calculates an input reflection coefficient of the input end based on the high frequency information, and calculates the output reflection coefficient based on the calculated input reflection coefficient and the acquired characteristic parameter.

Preferably, the impedance adjustment apparatus is further provided with a frequency detection unit for detecting the output frequency of the high frequency power source using the high frequency information.

Preferably, the high frequency power source outputs, to the impedance adjustment apparatus, information on an output frequency of a high frequency wave that is output, and the output frequency acquisition unit acquires the information on the output frequency that is input from the high frequency power source, as the output frequency of the high frequency power source.

According to the present invention, an impedance adjustment apparatus that is able to perform impedance matching using characteristic parameters, even in the case where an output frequency is adjusted (changed) using a high frequency power source employing a variable frequency system, can be provided.

DETAILED DESCRIPTION OF THE PREFERRED EMBODIMENTS

Figure 9:
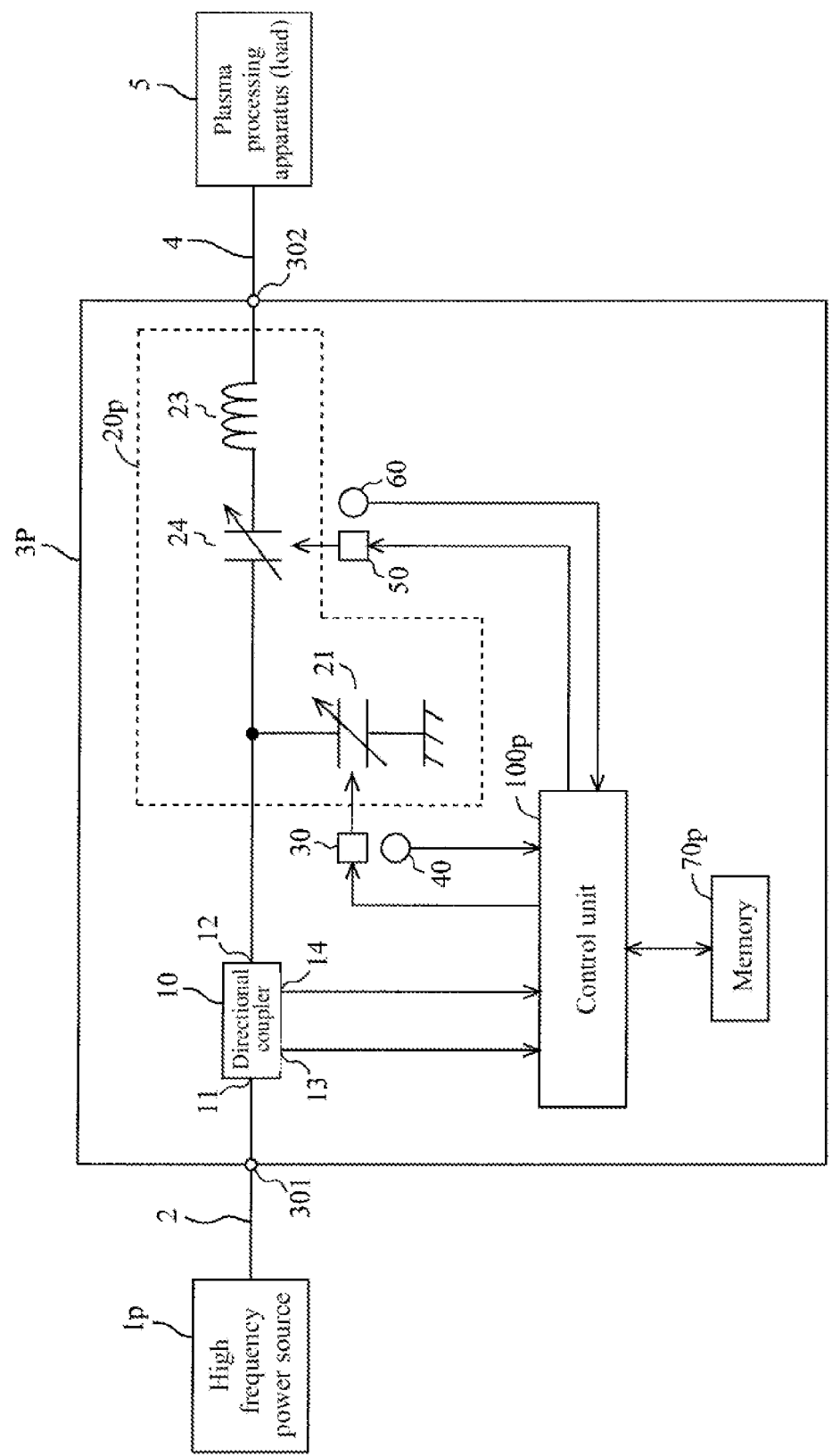
FIG. 9 is a block diagram showing an exemplary configuration of a high frequency power supply system that includes a conventional impedance adjustment apparatus.
Figure 10:
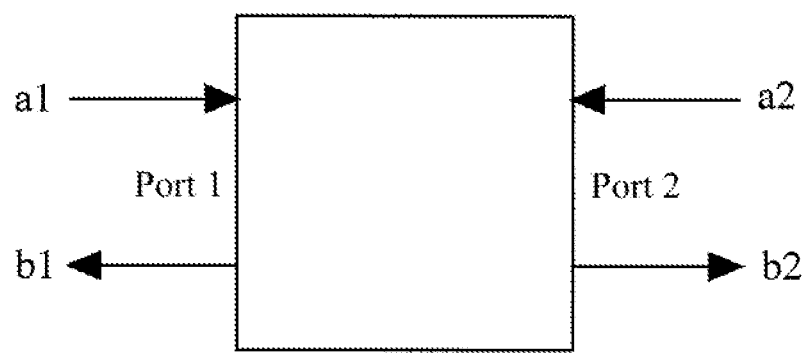
FIG. 10 is a concept diagram of a four-terminal network.
Figure 11:
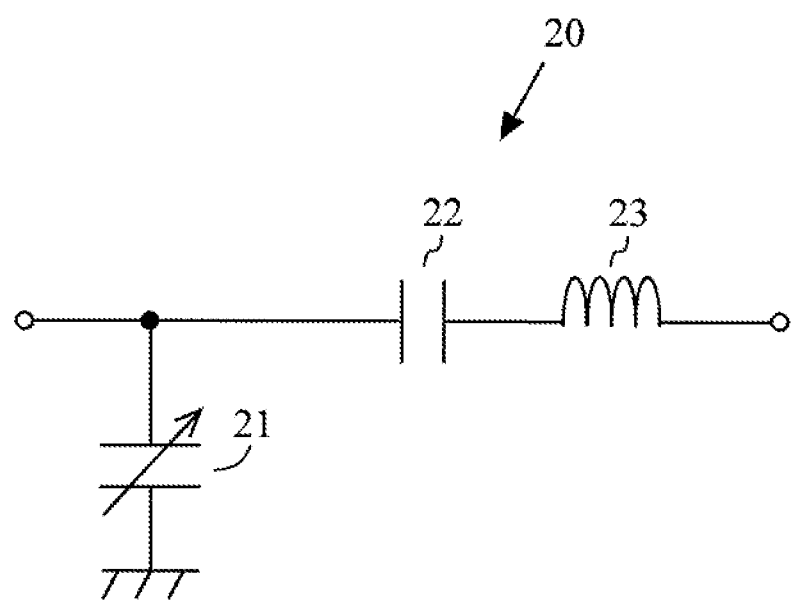
FIG. 11 is a diagram showing an example of an adjustment circuit.

Hereinafter, embodiments of the present invention will be described in detail with reference to the drawings. Note that the same signs are given to configuration that is the same as or similar to the conventional configuration shown in FIG. 9.

Figure 1:
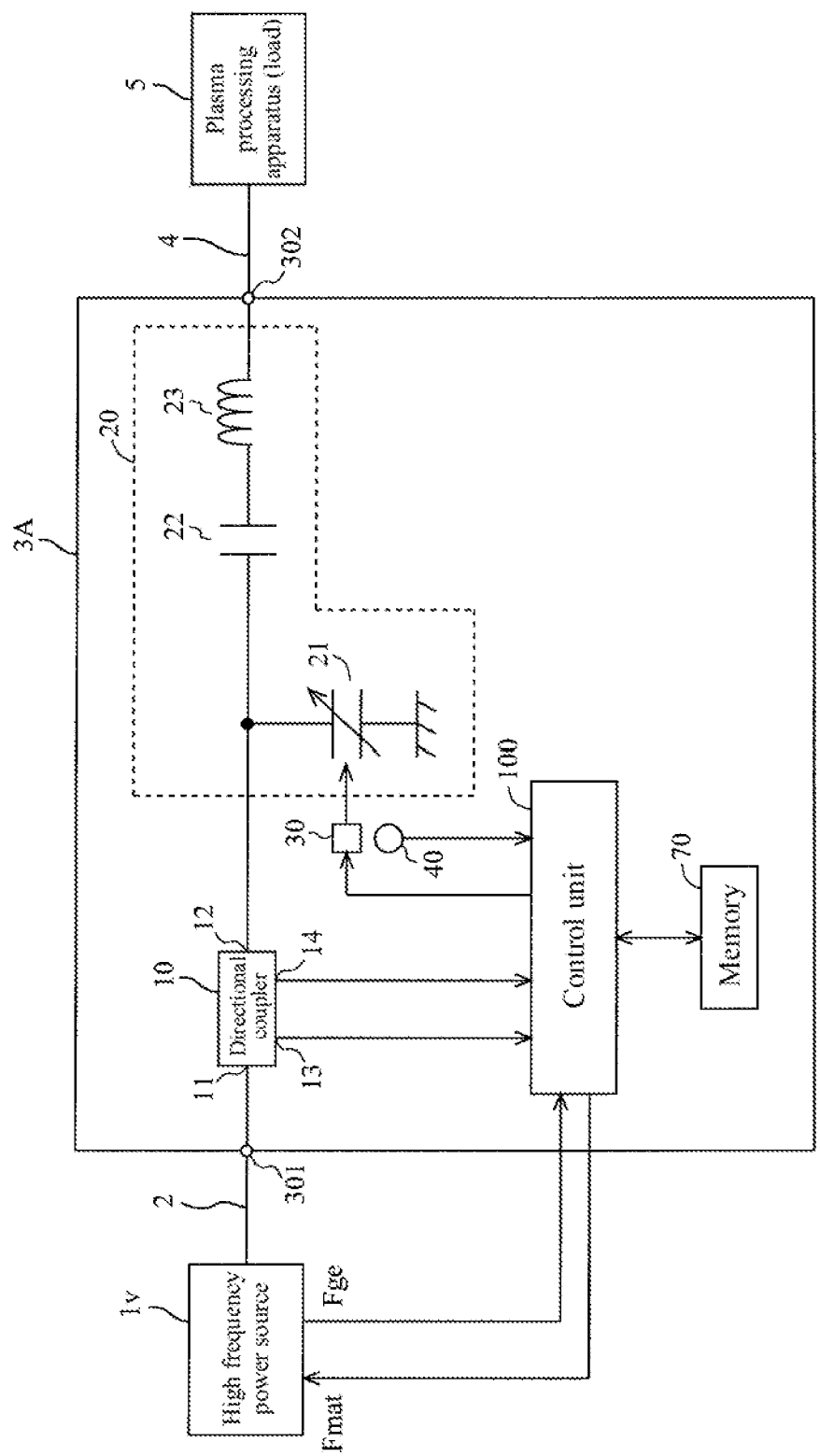
FIG. 1 is a block diagram showing an exemplary configuration of a high frequency power supply system to which an impedance adjustment apparatus that is based on an embodiment of the present invention is applied.

FIG. 1 is a block diagram showing an exemplary configuration of a high frequency power supply system to which an impedance adjustment apparatus 3A that is based on an embodiment of the present invention is applied.

The high frequency power supply system is a system that performs a processing process such as plasma etching, for example, on a workpiece such as a semiconductor wafer or a liquid crystal substrate. The high frequency power supply system is constituted by a high frequency power source 1v employing a variable frequency system, a transmission line 2, an impedance adjustment apparatus 3A, a load connecting portion 4, and a load 5 consisting of a plasma processing apparatus. Note that, in the present specification, a system that combines the high frequency power source 1v and the impedance adjustment apparatus 3A is a high frequency wave matching system.

The high frequency power source 1v is connected to an input end 301 of the impedance adjustment apparatus 3A via the transmission line 2, which consists of a coaxial cable, for example, and the load 5 is connected to an output end 302 via the load connecting portion 4. The load connecting portion 4 is covered with copper plate, in order to suppress leakage of electromagnetic waves.

The high frequency power source 1v is an apparatus that supplies high frequency power to the load 5. The output frequency of the high frequency power source 1v is a frequency in a wireless frequency band. A frequency in a wireless frequency band is generally a frequency in hundreds of kilohertz or tens of megahertz, with the output frequency of the high frequency power source 1v being a frequency such as 400 kHz, 2 MHz, 13.56 MHz or 50 MHz, for example. Note that the output frequency of the high frequency power source 1v is the frequency of a fundamental wave.

The output frequency of the high frequency power source 1v is changeable in a predetermined range. The variable range of the output frequency is set as appropriate in consideration of factors such as the performance of an oscillator (not shown) that is provided in the high frequency power source 1v. For example, in the case where the center frequency of the variable range is 2 MHz, the variable range of the output frequency is designed in a range of 2 MHz±10% (1.8-2.2 MHz).

Also, the output frequency is designed to be changed stepwise over 101 steps from "0" to "100", where "0" is the lower limit frequency of the variable range of the output frequency, and "100" is the upper limit frequency of the variable range of the output frequency, for example. Because the "0" step is 1.8 MHz and the "100" step is 2.2 MHz in the case where the variable range of the output frequency is 2 MHz±10% (1.8-2.2 MHz), the output frequency of the high frequency power source 1v is changed stepwise at a pitch of 0.004 MHz (4 kHz) in a range from 1.8 to 2.2 MHz.

It should be obvious that the output frequency and the variable range of the output frequency are not limited to the above. For example, the output frequency may also be set to a high output frequency of several hundred MHz. Also, the variable range of the output frequency may also be designed in a range of 2 MHz±5% (1.9-2.1).

The high frequency power source 1v recognizes the output frequency, and outputs information on the output frequency to the impedance adjustment apparatus 3A as power source recognition output frequency information $F_{ge}$. The power source recognition output frequency information $F_{ge}$ output from the high frequency power source 1v is input to a control unit 100 of the impedance adjustment apparatus 3A discussed later. Also, as discussed later, target output frequency information $F_{mat}$ that is used for impedance matching is input to the high frequency power source 1v from the control unit 100 of the impedance adjustment apparatus 3A. The high frequency power source 1v changes the output frequency based on the target output frequency information $F_{mat}$ that is input from the control unit 100.

The load 5 is a plasma processing apparatus for processing a workpiece such as a semiconductor wafer or a liquid crystal substrate, using a method such as etching or CVD. In the plasma processing apparatus, various types of processing processes are executed according to the purpose of processing the workpiece. For example, in the case of etching the workpiece, a processing process in which the type of gas appropriate for the etching, the gas pressure, the power supply value of high frequency power, the supply duration of high frequency power and the like are suitably set is performed. In the plasma processing apparatus, the workpiece is placed within a chamber (not shown) in which a plasma discharge gas is enclosed. The plasma discharge gas is then changed from a non-plasma state to a plasma state by supplying high frequency power from the high frequency power source 1v to a pair of electrodes within the chamber (not shown), and the workpiece is processed using the gas that is in a plasma state.

The impedance adjustment apparatus 3A matches the impedance of the high frequency power source 1v and the impedance of the load 5. More specifically, in the case where the output impedance of the high frequency power source 1v is designed to 50 Ω, and the high frequency power source 1v is connected to the input end 301 of the impedance adjustment apparatus 3A with a transmission line 2 having a characteristic impedance of 50 ohm, the impedance adjustment apparatus 3A adjusts the impedance seen from the input end 301 of the impedance adjustment apparatus 3A to the load 5 side to a value approaching 50 Ω. This adjustment results in the load-side impedance ZL seen from the output end of the high frequency power source 1v to the load 5 side being adjusted to a value approaching 50 Ω.

Note that although the characteristic impedance is 50 Ω in the present embodiment, the characteristic impedance is not limited to 50 Ω. Also, it is desirable to set the input reflection coefficient Γin of the input end 301 of the impedance adjustment apparatus 3A to 0, that is, to match the load-side impedance ZL to the characteristic impedance. However, because the impedances can normally be regarded as matched if the input reflection coefficient Γin is less than or equal to a predetermined tolerance value, in the present embodiment the impedance adjustment apparatus 3A adjusts the load-side impedance ZL such that input reflection coefficient Γin will be less than or equal to the predetermined tolerance value.

The impedance adjustment apparatus 3A is provided with a directional coupler 10, the control unit 100, an adjustment circuit 20, an adjustment unit 30, a position detection unit 40, and a memory 70. Also, the adjustment circuit 20 is provided with a variable capacitor 21, a capacitor 22 having a fixed impedance, and an inductor 23. The variable capacitor 21 is substantially the same variable capacitor as the first variable capacitor 21 in FIG. 9. The impedance adjustment apparatus 3A performs impedance matching by adjusting both the position of the movable portion (movable electrode) of the variable capacitor 21 provided in the adjustment circuit 20 and the output frequency of the high frequency power source 1v. A detailed description of the impedance matching operation of the impedance adjustment apparatus 3A will be given later.

Note that, as described above, because the position information of the movable portion of the variable capacitor 21 can be treated as information representing capacitance (capacitance information), this position information is treated as information representing the electrical characteristics of the variable capacitor 21 (electrical characteristic information).

The adjustment circuit 20 is not limited to the configuration shown in FIG. 1, and may have another configuration. For example, although the adjustment circuit 20 shown in FIG. 1 is generally called an L-type circuit, a known adjustment circuit such as a π-type circuit can be used. The type of circuit that is used is determined by factors such as the output frequency of the high frequency power source 1v and conditions of the load 5.

The directional coupler 10 separates and detects a high frequency wave that travels from the high frequency power source 1v to the load 5 side (hereinafter, traveling wave) and a high frequency wave reflected from the load 5 side (hereinafter, reflected wave). The directional coupler 10 outputs the detected traveling wave and reflected wave respectively at a traveling voltage and a reflected wave voltage. The directional coupler 10 has one input port 11 and three output ports 12, 13 and 14.

The high frequency power source 1v is connected to the input port 11, and the adjustment circuit 20 is connected to the first output port 12. Also, the second output port 13 and the third output port 14 are connected to the control unit 100.

Note that the directional coupler 10 functions as a portion of a high frequency information detection unit of the present invention. Also, a combination of the directional coupler 10 and a vectorization unit 110 discussed later is an example of the high frequency information detection unit of the present invention.

The traveling wave that is input to the directional coupler 10 from the input port 11 is output from the first output port 12 and the second output port 13. The traveling wave that is output from the first output port 12 is input to the adjustment circuit 20. The reflected wave that is reflected by the adjustment circuit 20 and input to the directional coupler 10 from the first output port 12 is output from the input port 11 and the third output port 14. The traveling wave that is output from the second output port 13 and the reflected wave that is output from the third output port 14 are input to the control unit 100 after being attenuated to a suitable level by an attenuator (not shown).

Note that a high frequency detector can be used instead of the directional coupler 10. The high frequency detector detects high frequency voltage and high frequency current that are input from the high frequency power source 1v to the input end 301, and a phase difference thereof (phase difference between the high frequency voltage and high frequency current), for example. The high frequency voltage, the high frequency current and the phase difference detected by the high frequency detector are input to the control unit 100.

The control unit 100 serves as a control center of the impedance adjustment apparatus 3A. The control unit 100 has a CPU, a memory, a ROM and the like not shown. The control unit 100 can also be constituted using a gate array that can appropriately define and change a logic circuit provided therein, such as FPGA (Field Programmable Gate Array), for example. The control unit 100 changes the capacitance of the variable capacitor 21 and the output frequency of the high frequency power source 1v to adjust the impedance of the adjustment circuit 20, based on the traveling wave voltage and reflected wave voltage that are output from the directional coupler 10.

The adjustment unit 30 is connected to the movable portion (movable electrode) of the variable capacitor 21. The adjustment unit 30 is a drive means for displacing the position of the movable portion of the variable capacitor 21. The adjustment unit 30 is constituted by a stepping motor, a motor drive circuit and the like (all not shown), for example. The motor drive circuit provided in the adjustment unit 30 drives the stepping motor based on a command signal that is input from the control unit 100, and displaces the position of the movable portion of the variable capacitor 21. In the present embodiment, the capacitance of the variable capacitor 21 can be adjusted over 101 steps, for example. The control unit 100 adjusts the capacitance of the variable capacitor 21 stepwise by controlling the amount of rotation of the stepping motor provided in the adjustment unit 30. Note that the adjustment unit 30 is an example of an electrical characteristic element adjustment unit of the present invention.

The position detection unit 40 that detects the position of the movable portion that is adjusted by the adjustment unit 30 is provided in the variable capacitor 21. Position information of the movable portion of the variable capacitor 21 detected by the position detection unit 40 is input to the control unit 100. The control unit 100 recognizes the position of the movable portion of the variable capacitor 21 based on this position information. Note that the position detection unit 40 is an example of an electrical characteristic acquisition unit of the present invention.

The memory 70 is connected to the control unit 100. Characteristic parameters of the impedance adjustment apparatus 3A measured in advance are stored in the memory 70. The characteristic parameters are S-parameters indicating the transmission characteristics in the case where the entire impedance adjustment apparatus 3A is regarded as a transmission apparatus or T-parameters converted from the S-parameters. The characteristic parameters stored in the memory 70 are the measured values of S-parameters measured after setting the position (capacitance) of the movable portion of the variable capacitor 21 to a position set as a measurement target and inputting a high frequency wave of the frequency set as a measurement target to the impedance adjustment apparatus 3A, or T-parameters converted from the measured values of the S-parameters. The positions of the movable portion and the frequencies of the high frequency wave serving as measurement targets are the variable positions of the movable portion of the variable capacitor 21 and the output frequencies of the high frequency power source 1v that are included in a portion of combinations extracted from among all combinations of the stepwise variable positions of the movable portion of the variable capacitor 21 and the stepwise change values of the output frequency of the high frequency power source 1v. Note that the memory 70 is an example of a characteristic parameter storage unit of the present invention.

In the present embodiment, position information of the movable portion of the variable capacitor 21 is represented with a variable C, output frequency information of the high frequency power source 1v is represented with a variable F, and combination information of the position of the movable portion of the variable capacitor 21 and the output frequency of the high frequency power source 1v is represented in coordinate form such as (C,F). In the above example, "C" changes stepwise over a range of 0 to 100 (101 steps), and "F" changes stepwise over a range of 0 to 100 (101 steps). Accordingly, in the present embodiment, there are (101×101=) 10201 sets of combination information (C,F). It should be obvious that a configuration may be adopted in which the variable C and the variable F change over other ranges.

Table 2 shows an example in which S-parameters are stored in the memory 70 as characteristic parameters, and Table 3 shows an example in which T-parameters are stored in the memory 70 as characteristic parameters.

TABLE 2

| | | C | | | | | | |
|---|---|---|---|---|---|---|---|---|
| | | 0 | 10 | 20 | ... ... | 80 | 90 | 100 |
| F | 0 | S (0, 0) | S (10, 0) | S (20, 0) | ... ... | S (80, 0) | S (90, 0) | S (100, 0) |
| | 10 | S (0, 10) | S (10, 10) | S (20, 10) | ... ... | S (80, 10) | S (90, 10) | S (100, 10) |
| | 20 | S (0, 20) | S (10, 20) | S (20, 20) | ... ... | S (80, 20) | S (90, 20) | S (100, 20) |
| | ... | ... | ... | ... | ... ... | ... | ... | ... |
| | ... | ... | ... | ... | ... ... | ... | ... | ... |
| | 80 | S (0, 80) | S (10, 80) | S (20, 80) | ... ... | S (80, 80) | S (90, 80) | S (100, 80) |
| | 90 | S (0, 90) | S (10, 90) | S (20, 90) | ... ... | S (80, 90) | S (90, 90) | S (100, 90) |
| | 100 | S (0, 100) | S (10, 100) | S (20, 100) | ... ... | S (80, 100) | S (90, 100) | S (100, 100) |

TABLE 3

| | | C | | | | | | |
|---|---|---|---|---|---|---|---|---|
| | | 0 | 10 | 20 | ... ... | 80 | 90 | 100 |
| F | 0 | T (0, 0) | T (10, 0) | T (20, 0) | ... ... | T (80, 0) | T (90, 0) | T (100, 0) |
| | 10 | T (0, 10) | T (10, 10) | T (20, 10) | ... ... | T (80, 10) | T (90, 10) | T (100, 10) |
| | 20 | T (0, 20) | T (10, 20) | T (20, 20) | ... ... | T (80, 20) | T (90, 20) | T (100, 20) |
| | ... | ... | ... | ... | ... ... | ... | ... | ... |
| | ... | ... | ... | ... | ... ... | ... | ... | ... |
| | 80 | T (0, 80) | T (10, 80) | T (20, 80) | ... ... | T (80, 80) | T (90, 80) | T (100, 80) |
| | 90 | T (0, 90) | T (10, 90) | T (20, 90) | ... ... | T (80, 90) | T (90, 90) | T (100, 90) |
| | 100 | T (0, 100) | T (10, 100) | T (20, 100) | ... ... | T (80, 100) | T (90, 100) | T (100, 100) |

The S-parameters shown in Table 2 were obtained by measuring the S-parameters of the impedance adjustment apparatus 3A while changing the position of the movable portion of the variable capacitor 21 and the frequency of the high frequency wave that is input to the impedance adjustment apparatus 3A to values corresponding to each set of combination information (C,F) serving as a measurement target, using 121 sets of combination information (C,F) combining 11 variables C obtained by changing the range of 0 to 100 over 10 steps and 11 variables F obtained by changing the range of 0 to 100 over 10 steps as measurement targets.

Note that since combination information (C,F) denotes combination information of position information C of the movable portion of the variable capacitor 21 and output frequency information F of the high frequency power source 1v, the corresponding position of the movable portion of the variable capacitor 21 and output frequency of the high frequency power source 1v will be known if this combination information is known. That is, the capacitance information of the variable capacitor 21 (electrical characteristic information) and the output frequency of the high frequency power source 1v will be known. For this reason, rather than simply storing the S-parameters or the T-parameters in the memory 70, the S-parameters or the T-parameters are stored in association with the combination information (C,F) of the position of the movable portion of the variable capacitor 21 and the output frequency of the high frequency power source iv.

In Table 2, S(C,F) shows the S-parameter of the impedance adjustment apparatus 3A measured after setting the position of the movable portion of the variable capacitor 21 to a position corresponding to "C" and setting the frequency of the high frequency wave that is input to the impedance adjustment apparatus 3A to a frequency corresponding to "F". For example, S(0,0) indicates the S-parameter measured after setting the position of the movable portion of the variable capacitor 21 to a position corresponding to C=0 and setting the frequency of the high frequency wave that is input to the impedance adjustment apparatus 3A to a frequency corresponding to F=0. Similarly, S(100,0) shows the S-parameter measured after setting the position of the movable portion of the variable capacitor 21 to a position corresponding to C=100 and setting the frequency of the high frequency wave that is input to the impedance adjustment apparatus 3A to a frequency corresponding to F=0.

The T-parameters shown in Table 3 are obtained by converting the measured values of the S-parameters shown in Table 2 into the T-parameters using the conversion equation shown in Equation 2. The T-parameters are stored in the memory 70 in association with the combination information (C,F) of the position of the movable portion of the variable capacitor 21 and the output frequency of the high frequency power source 1v.

Accordingly, T(C,F) in Table 3 shows the T-parameter measured after setting the position of the movable portion of the variable capacitor 21 to a position corresponding to "C" and setting the output frequency of the high frequency power source 1v to a frequency corresponding to "F". For example, T(0,0) shows the T-parameter measured after setting the position of the movable portion of the variable capacitor 21 to a position corresponding to C=0 and setting the output frequency of the high frequency power source 1v to a frequency corresponding to F=0. Similarly, T(100,0) shows the T-parameter measured after setting the position of the movable portion of the variable capacitor 21 to a position corresponding to C=100 and setting the output frequency of the high frequency power source 1v to a frequency corresponding to F=0.

Figure 2:
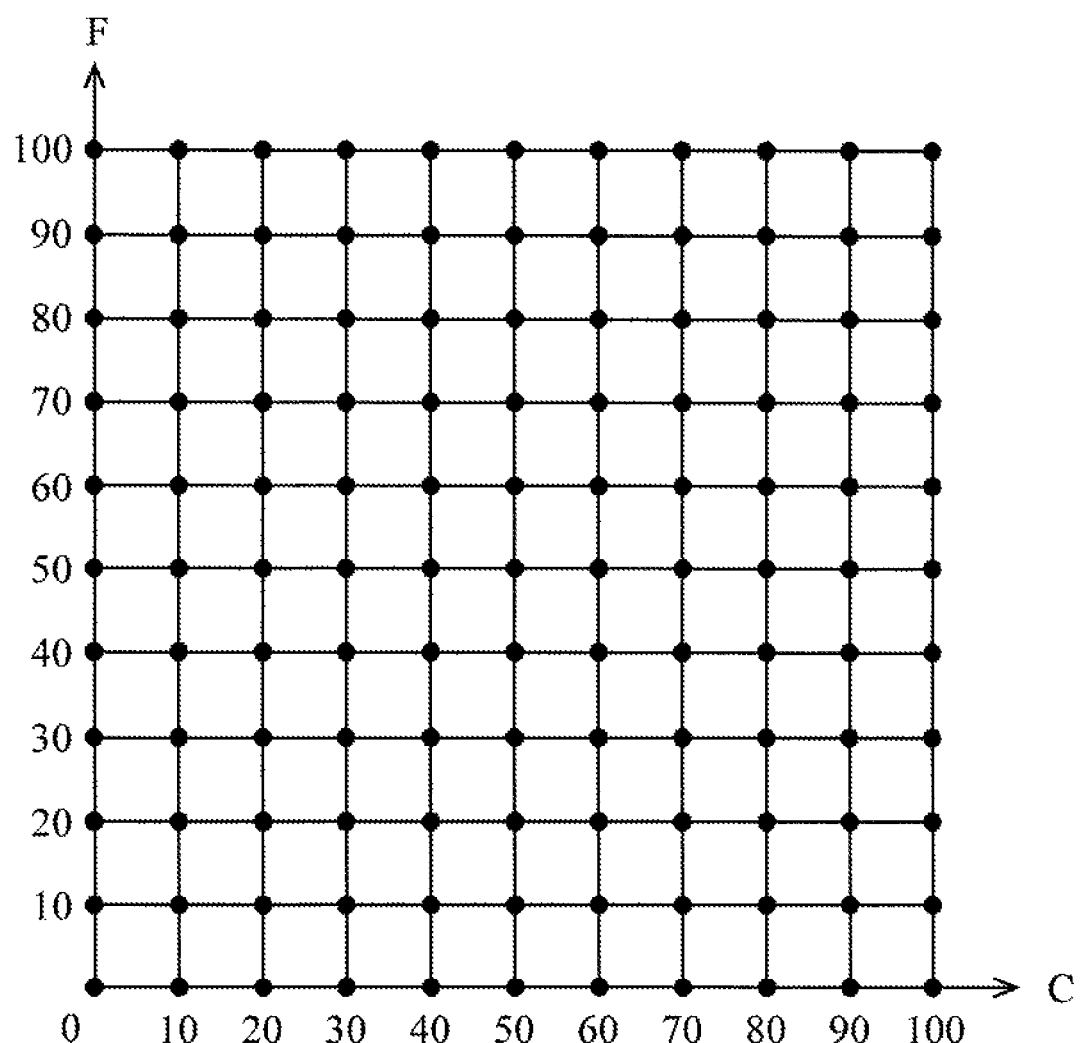
FIG. 2 is a diagram showing an example of S-parameters or T-parameters stored in the memory.

FIG. 2 illustrates, as coordinates (C,F), combinations of the position information of the movable portion of the variable capacitor 21 and the output frequency information of the high frequency power source lv used to measure the S-parameters or the T-parameters that are stored in the memory 70. In FIG. 2, the horizontal axis is the position information C of the movable portion of the variable capacitor 21, and the vertical axis is the output frequency information F of the high frequency power source 1v. Also, the black dots indicate the positions of the sets of combination information (C,F) where the S-parameters or the T-parameters were measured. As shown in FIG. 2, the S-parameters or the T-parameters of the impedance adjustment apparatus 3A are not measured for all combinations of the variable numbers of the movable portion of the variable capacitor 21 and the variable numbers of the output frequency of the high frequency power source 1v but rather for a portion of combinations.

As described above, although the S-parameters are simple to measure in the measurement of transmission characteristics, the T-parameters are simple to use in calculations performed in impedance matching, and thus, usually, values obtained by converting S-parameters into T-parameters are stored in the memory 70. In the case where S-parameters are stored in the memory 70, the S-parameters are read from the memory 70 when performing impedance matching, and converted into T-parameters for use in calculations. However, because operation load increases when processing for converting the S-parameters into the T-parameters is performed at the time of impedance matching, it is more preferable to store the T-parameters in the memory 70 in advance. In the following description, it is assumed that T-parameters are stored in the memory 70 and impedance matching is performed using those T-parameters.

It is preferable, from the viewpoint of accuracy, to measure the S-parameters for all combinations of the values that can be taken by the position of the movable portion of the variable capacitor 21 and the values that can be taken by the output frequency of the high frequency power source 1v. However, many measurement man hours would be required, because the amount of measurement would be considerable when measuring the S-parameters for all combinations. In the present embodiment, in order to ease the calculation load, rather than measuring the S-parameters for all combinations, S-parameters are measured for a portion of combinations, and the S-parameters that have not been measured are interpolated through performing interpolation by linear approximation using the measured values. As the method of interpolation, bi-linear interpolation is used, for example. The same applies to the T-parameters converted from the S-parameters.

The method of deriving the S-parameters that have not been measured by linear interpolation will be described using FIG. 3.

In the following description, an element $S_{11}$ of the S-parameters is taken as an example. Also, the elements of the S-parameters are represented by "element names ($S_{11}$, etc.) of the S-parameters" and "combination information (C,F)". For example, the element $S_{11}$ of S(10,10) is represented as $S_{11}$(10,10), the element $S_{11}$ of S(10,20) is represented as $S_{11}$(10,20), the element $S_{11}$ of S(20,10) is represented as $S_{11}$(20, 10) and the element $S_{11}$ of S(20,20) is represented as $S_{11}$(20, 20). Accordingly, in FIG. 3, the measured value of $S_{11}$(110, 10) is shown as being 100, the measured value of $S_{11}$(10,20) is shown as being 170, the measured value of $S_{11}$(20,10) is shown as being 160, and the measured value of $S_{11}$(20,20) is shown as being 200. Note that each value of element $S_{11}$ shown in FIG. 3 is not an actual measured value but an exemplary numerical value for illustrating linear interpolation.

For example, an element $S_{11}$(18,16) of the S-parameter for the combination information (C,F)=(18,16) that has not been measured is derived by the interpolation operations of the following first to third steps.

First step: Derive an estimated value of $S_{11}$(18,10) by interpolation, using the measured value 100 of $S_{11}$(10,10) and the measured value 160 of $S_{11}$(20,10).

Second step: Derive an estimated value of $S_{11}$(18,20) by interpolation, using the measured value 170 of $S_{11}$(10,20) and the measured value 200 of $S_{11}$(20,20).

Third step: Derive an estimated value of $S_{11}(18,16)$ by interpolation, using the estimated value of $S_{11}(18,10)$ and the estimated value of $S_{11}(18,20)$ derived at the first step and the second step.

Specifically, the interpolation operation of each step is as follows.

Estimated value of $S_{11}(18,10)$: 100×0.2+160×0.8=148
Estimated value of $S_{11}(18,20)$: 170×0.2+200×0.8=194
Estimated value of $S_{11}(18,16)$: 148×0.4+194×0.6=175.6

Accordingly, the estimated value of $S_{11}(18,16)$ is 175.6.

The estimated values of the other elements $S_{12}(18,16)$, $S_{21}(18,16)$ and $S_{22}(18,16)$ can also be respectively derived by similar calculations.

Figure 3:
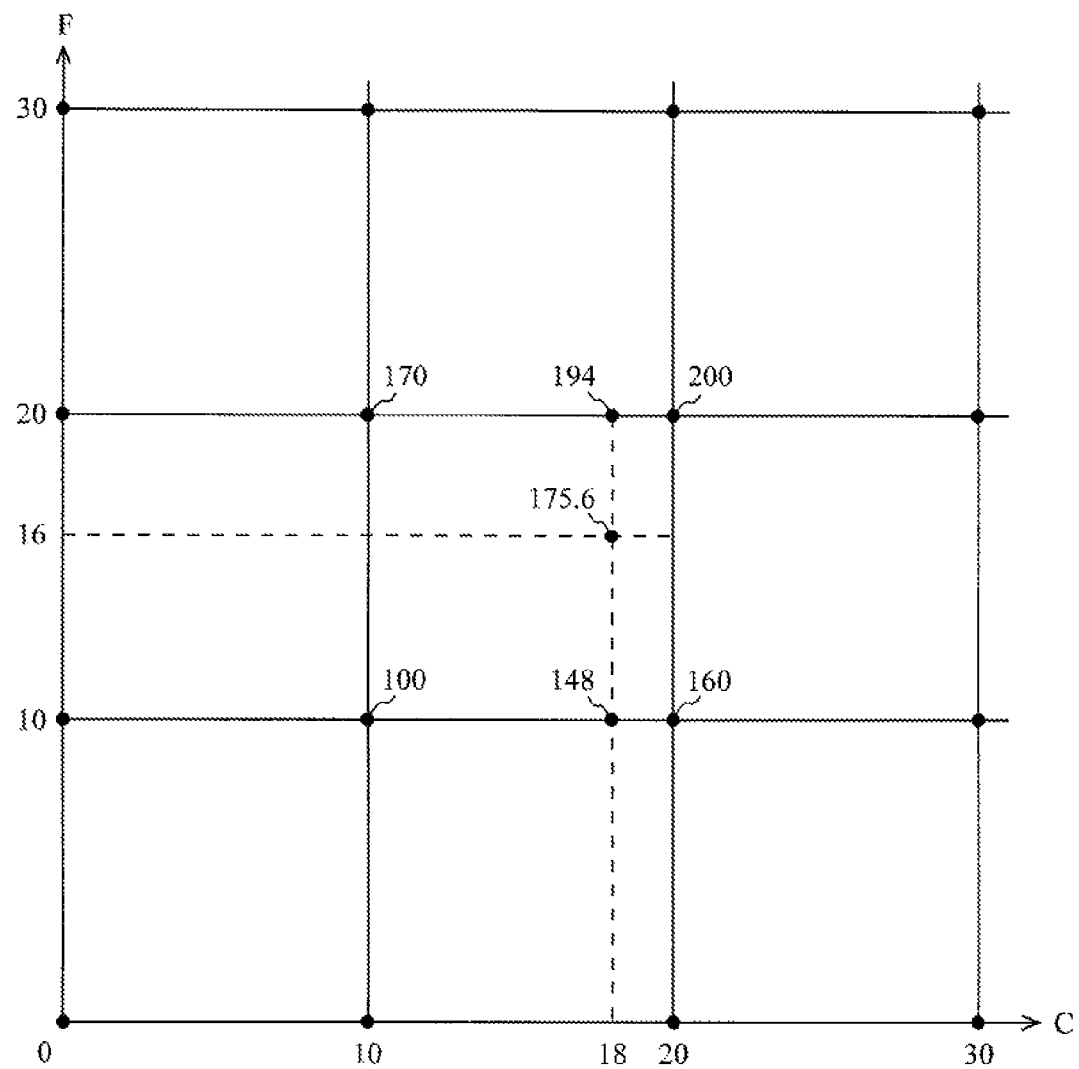
FIG. 3 is a diagram for illustrating a method of using linear interpolation to derive S-parameters that have not been measured.

Because S-parameters are usually measured after setting a portion of combination information sets (C,F) extracted in a grid as measurement targets, among all sets of combination information (C,F), as shown in FIG. 3, in the case where the combination information (C,F) for deriving an S-parameter by interpolation is in an area surrounded by four sets of combination information (C,F) that have been measured, four S-parameters that have been measured are used in the interpolation operation, as in the above example. In the case where the combination information (C,F) for deriving the S-parameter is between two sets of combination information (C,F) that have been measured, the calculation is easy because the S-parameter of that combination information (C,F) can be interpolated using the two S-parameters that have been measured.

When measurement targets are extracted in a grid as shown in Table 2, there is an advantage in that the interpolation operation for deriving the S-parameters of combination information (C,F) for which measurement has not been performed is easily performed. It should be obvious that the interpolation operation can be performed even when the sets of combination information (C,F) for which S-parameters have been measured are not in a grid.

Figure 4:
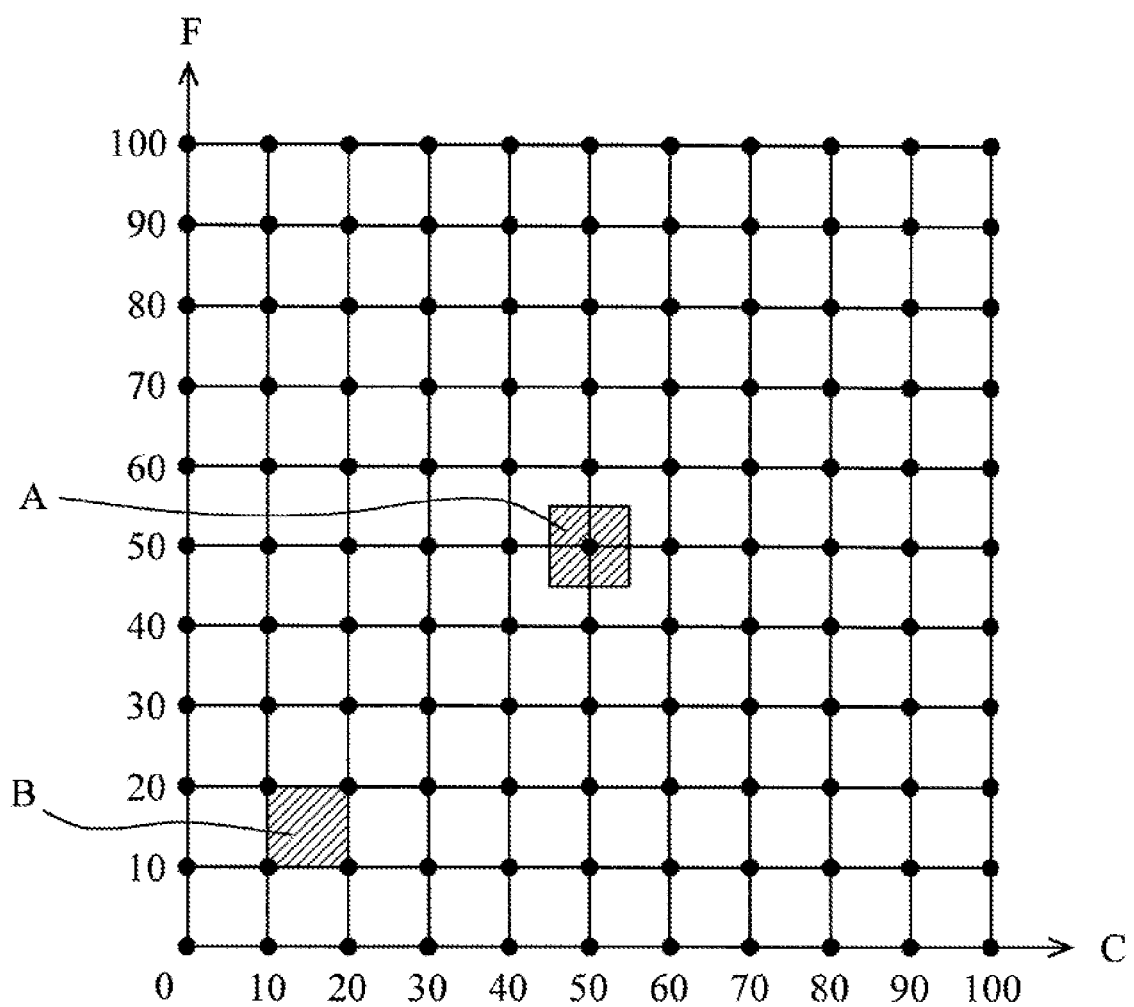
FIG. 4 is an example in a case of measuring the S-parameters in a grid, and measuring the S-parameters with respect to combination information of another portion.

Although S-parameters were measured for a portion of combination information sets (C,F) extracted in a grid, among all sets of combination information (C,F), in the example in Table 2, S-parameters may also be measured for another portion of combination information sets (C,F), in addition to the portion of combination information sets (C,F) extracted in a grid, as shown in FIG. 4.

In FIG. 4, the horizontal axis is the position information C of the movable portion of the variable capacitor 21, and the vertical axis is the output frequency information F of the high frequency power source 1v. FIG. 4 shows an example in which S-parameters are also measured for combination information sets (C,F) included to an area A and an area B in addition to the combination information sets (C,F) that are indicated by the black dots.

For example, in the case where the combination information sets (C,F) that are expected to be used in impedance matching are known, it is favorable to measure the S-parameters for all sets of combination information (C,F) that are included in a predetermined range that is based on those combination information sets (C,F). In this way, measuring S-parameters for combination information sets (C,F) that are substantively required enables accurate impedance matching to be performed, while suppressing any increase in man hours or memory capacity for measuring S-parameters.

Also, although the four S-parameters [S(10,10)], [S(20, 10)], [S(10,20)] and [S(20,20)] surrounding the S-parameter [S(18,16)] that is to be estimated are used, among the measured S-parameters, to calculate the estimated value of the S-parameter [S(18,16)] in the example in FIG. 3, the four S-parameters that are used in the calculations are not limited to these parameters. For example, the estimated value of the S-parameter [S(18,16)] may be interpolated using the four S-parameters, [S(0,0)], [S (30, 0)], [S(0,30)] and [S (30, 30)]. Because the accuracy of the estimated value is thought to deteriorate as the distance between the S-parameter that is to be estimated and the measured S-parameters that are used in the interpolation operation increases, the S-parameters to be used in the interpolation operation need to be appropriately determined with consideration for accuracy and convenience.

Because S-parameters that have not been measured can be estimated by interpolation from S-parameters measured in advance as described above, the estimated values of S-parameters may be derived by interpolation for combination information sets (C,F) for which the S-parameter has not been measured, among all sets of combination information (C,F), and both the measured values and the estimated values of the S-parameters may stored in advance in the memory 70 in association with the combination information sets (C,F). In this case, estimated values may be derived for all sets of combination information (C,F) for which measurement has not been performed, or estimated values may be derived for only a portion of combination information sets (C,F) among all sets of combination information (C,F) for which measurement has not been performed. Also, T-parameters converted from the S-parameters using the conversion equation of Equation 2 may be stored in the memory 70. Note that when the estimated values of S-parameters or the estimated values of T-parameters converted from the estimated values of S-parameters are stored in the memory 70, the calculation load when impedance matching is performed can be reduced but a large memory capacity is required, and thus an appropriate selection should be made according to the actual situation.

As described above, in the case of storing the estimated values of S-parameters or the estimated values of T-parameters converted from the estimated values of S-parameters in the memory 70, a configuration may be adopted in which measured S-parameters or T-parameters converted from measured S-parameters are stored in a first storage area within the memory 70, and the estimated values of S-parameters or the estimated values of T-parameters converted from the estimated values of S-parameters are stored in an second storage area within the memory 70, for example.

It should be obvious that the first storage area and second storage area may be provided in the same hardware or may be provided in different hardware. Also, in the case where the first storage area and the second storage area are provided in the same hardware, a configuration may be adopted in which the first storage area and second storage area are divided into areas of predetermined capacity or are not divided. Note that it is preferable to adopt a configuration in which it can be distinguished whether S-parameters or T-parameters that are stored are measured S-parameters or T-parameters converted from measured S-parameters, or whether they are estimated values of S-parameters or estimated values of T-parameters converted from estimated values of S-parameters.

Although an example in which S-parameters are interpolated was described above, T-parameters corresponding to S-parameters that have not been measured can be estimated by linear interpolation, using T-parameters converted from measured S-parameters. The interpolation method is similar to the above case of S-parameters.

Note that in the case where measured S-parameters are converted into T-parameters, T-parameters corresponding to combination information sets (C,F) for which the S-parameter has not been measured can be derived by interpolation in the following manner.

That is, as shown in FIG. 2, the data interval on the variable C axis of measured S-parameters (T-parameters) is given as $c_0$ (in the FIG. 2 example, $c_0$=10), and the data interval on the variable F axis is given as $f_0$ (in the FIG. 2 example, $f_0$=10). Also, the integer portion and fractional portion of $C/c_0$ are given respectively as $n_c$ and $d_c$, the integer portion and fractional portion of $F/f_0$ are given respectively as $n_f$ and $d_f$.

For example, if the position of the movable portion of the variable capacitor 21 is "83", and the data interval $c_0$ is "10", $n_c$=8 and $d_c$=0.3.

In this case, the elements $T_{11}$, $T_{12}$, $T_{21}$ and $T_{22}$ constituting T-parameters converted from S-parameters are represented as in Equation 7.

⟨Equation 7⟩

$$T_{11} = T_{11}(n_c c_0, n_f f_0) +$$
$$\{T_{11}[(n_c+1)c_0, n_f f_0] - T_{11}(n_c c_0, n_f f_0)\}d_c +$$
$$\{T_{11}[n_c c_0, (n_f+1)f_0] - T_{11}(n_c c_0, n_f f_0)\}d_f +$$
$$\left\{ \begin{array}{l} T_{11}(n_c c_0, n_f f_0) - T_{11}[(n_c+1)c_1, n_f f_0] - \\ T_{11}[n_c c_1, (n_f+1)f_0] + T_{11}[(n_c+1)c_0, (n_f+1)f_0] \end{array} \right\} d_c d_f$$

$$T_{12} = T_{12}(n_c c_0, n_f f_0) +$$
$$\{T_{12}[(n_c+1)c_0, n_f f_0] - T_{12}(n_c c_0, n_f f_0)\}d_c +$$
$$\{T_{12}[n_c c_0, (n_f+1)f_0] - T_{12}(n_c c_0, n_f f_0)\}d_f +$$
$$\left\{ \begin{array}{l} T_{12}(n_c c_0, n_2 f_0) - T_{12}[(n_c+1)c_0, n_f f_0] - \\ T_{12}[n_c c_0, (n_f+1)f_0] + T_{12}[(n_c+1)c_1, (n_f+1)f_0] \end{array} \right\} d_c d_f$$

$$T_{21} = T_{21}(n_c c_0, n_f f_0) +$$
$$\{T_{21}[(n_c+1)c_1, n_f f_0] - T_{21}(n_c c_0, n_f f_0)\}d_c +$$
$$\{T_{21}[n_c c_0, (n_f+1)f_0] - T_{21}(n_c c_0, n_f f_0)\}d_f +$$
$$\left\{ \begin{array}{l} T_{21}(n_c c_0, n_f f_0) - T_{21}[(n_c+1)c_0, n_f f_0] - \\ T_{21}[n_c c_0, (n_f+1)f_0] + T_{21}[(n_c+1)c_0, (n_f+1)f_0] \end{array} \right\} d_c d_f$$

$$T_{22} = T_{22}(n_c c_0, n_f f_0) +$$
$$\{T_{22}[(n_c+1)c_0, n_f f_0] - T_{22}(n_c c_0, n_f f_0)\}d_c +$$
$$\{T_{22}[n_c c_0, (n_f+1)f_0] - T_{22}(n_c c_0, n_f f_0)\}d_f +$$
$$\left\{ \begin{array}{l} T_{22}(n_c c_0, n_f f_0) - T_{22}[(n_c+1)c_0, n_f f_0] - \\ T_{22}[n_c c_0, (n_f+1)f_0] + T_{22}[(n_c+1)c_0, (n_f+1)f_0] \end{array} \right\} d_c d_f$$

Next, a method of measuring the data of S-parameters will be described.

[Measurement Circuit for Measuring S-Parameters]

Figure 5:
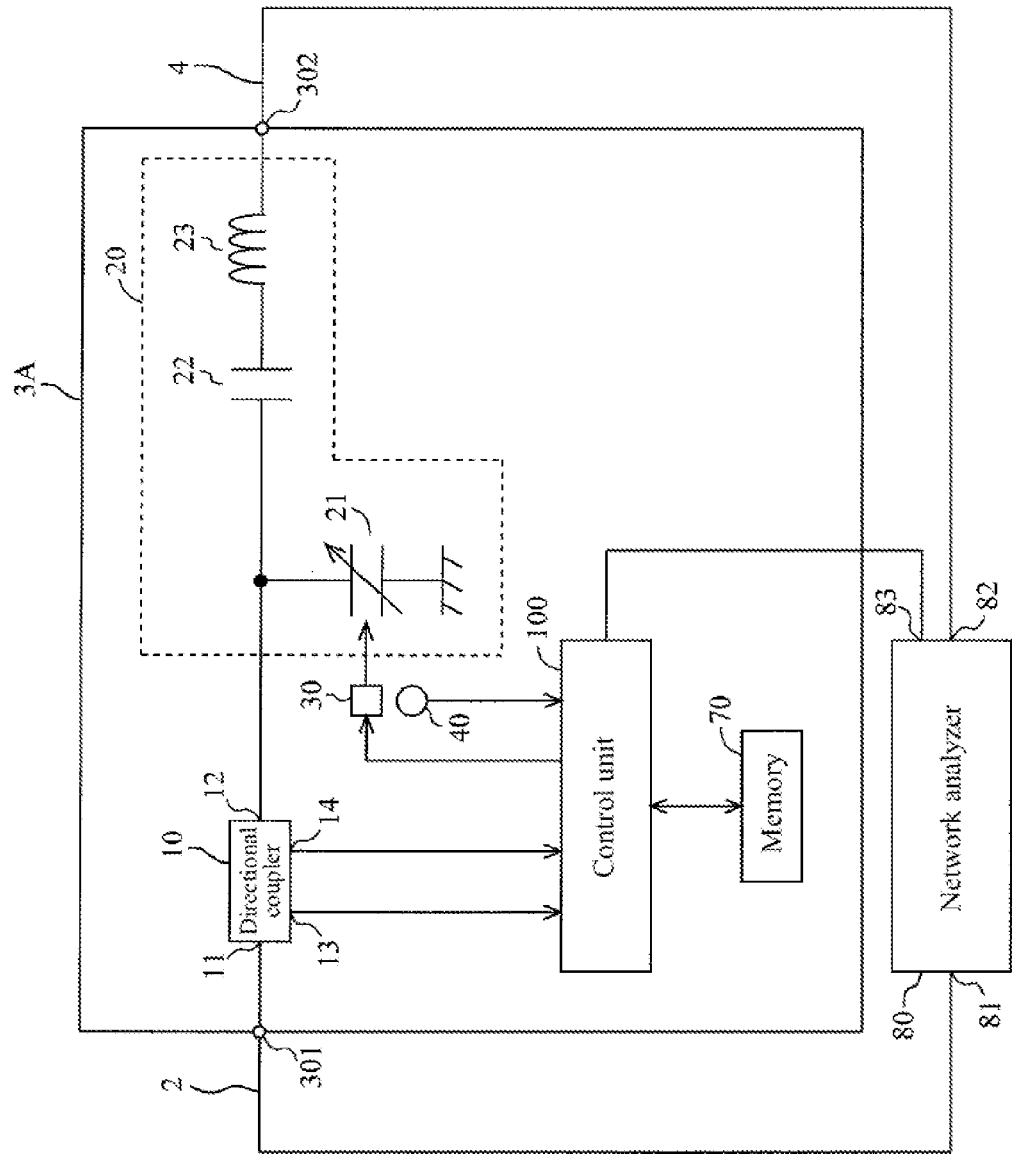
FIG. 5 is a diagram showing a configuration of a measurement circuit for measuring S-parameters of the impedance adjustment apparatus.

FIG. 5 is a diagram showing a configuration of a measurement circuit for measuring S-parameters of the impedance adjustment apparatus 3A. The measurement circuit shown in FIG. 5 is factory assembled, for example, before product shipment.

S-parameters of the impedance adjustment apparatus 3A are measured using a network analyzer 80 having an input/output impedance of 50Ω, for example. A first input/output terminal 81 of the network analyzer 80 is connected to the input end 301 of the impedance adjustment apparatus 3A, and a second input/output terminal 82 of the network analyzer 80 is connected to the output end 302 of the impedance adjustment apparatus 3A. Also, a control terminal 83 of the network analyzer 80 is connected to the control unit 100 of the impedance adjustment apparatus 3A.

[Procedure for Measuring S-Parameters]

The procedure for measuring S-parameters for individual sets of combination information (C,F) with respect to which the position of the movable portion of the variable capacitor 21 and the output frequency of the high frequency power source 1*v* have been respectively changed at intervals of ten steps, as shown in Table 2, will be described, assuming that the variation ranges of the position of the movable portion of the variable capacitor 21 and the output frequency of the high frequency power source 1*v* are respectively 101 steps from 0 to 100.

In the measurement circuit shown in FIG. 5, S-parameters of the impedance adjustment apparatus 3A are measured by the network analyzer 80 while successively changing the combination information sets (C,F) in a predefined order. In the following description, the procedure for respectively measuring S-parameters while successively changing the position of the movable portion of the variable capacitor 21 and the output frequency at intervals of 10 will be described, assuming that the combination information sets (C,F) at the grid points shown in Table 2 are the measurement targets.

The position of the movable portion of the variable capacitor 21 and the output frequency of the network analyzer 80 are set to values corresponding to the initial set of combination information (C,F) by the control unit 100. For example, when the initial set of combination information (C,F) has been set to (0,0), the control unit 100 sets the position of the movable portion of the variable capacitor 21 to a position corresponding to "0", for example, and sets the output frequency of the network analyzer 80 to a frequency (e.g., 1.8 MHz) corresponding to "0", for example. This frequency is equivalent to the output frequency of the high frequency wave that is supplied from the high frequency power source 1*v* to the load 5.

The network analyzer 80 first outputs a high frequency wave having a frequency (e.g., 1.8 MHz) corresponding to "0" from the first input/output terminal 81. The high frequency wave (incident wave) output from the first input/output terminal 81 is partially reflected by the input end 301 of the impedance adjustment apparatus 3A, and the remainder of the high frequency wave is input to the impedance adjustment apparatus 3A. The high frequency wave (reflected wave) reflected by the input end 301 of the impedance adjustment apparatus 3A is input from the first input/output terminal 81 into the network analyzer 80. The high frequency wave (transmitted wave) input into the impedance adjustment apparatus 3A from the input end 301 is output from the output end 302, and is input into the network analyzer 80 from the second input/output terminal 82.

The network analyzer 80 detects the reflected wave input from the first input/output terminal 81 and the transmitted wave input from the second input/output terminal 82. The network analyzer 80 measures the voltage reflection coefficient (element $S_{11}$ of S-parameter) on the input side and the transmission coefficient (element $S_{21}$ of S-parameter) of the forward voltage, using the detected values of the reflected wave and transmitted wave and the incident wave. That is, when the incident wave, the reflected wave and the transmitted wave are given respectively as a1, b1 and b2, the network analyzer 80 measures the voltage reflection coefficient ($S_{11}$) and the transmission coefficient ($S_{21}$) of the forward voltage by calculating $S_{11}$=b1/a1 and $S_{21}$=b2/a1.

Next, the network analyzer 80 outputs a high frequency wave having a frequency (e.g., 1.8 MHz) corresponding to "0" from the second input/output terminal 82. The high frequency wave (incident wave) output from the second input/output terminal 81 is partially reflected by the output end 302 of the impedance adjustment apparatus 3A, and the remainder of the high frequency wave is input to the impedance adjustment apparatus 3A. The high frequency wave (reflected wave) reflected by the output end 302 of the impedance adjustment apparatus 3A is input into the network analyzer 80 from the second input/output terminal 82. The high frequency wave (transmitted wave) input into the impedance adjustment apparatus 3A from the output end 302 is output from the input end 301 and input to the network analyzer 80 from the first input/output terminal 81.

The network analyzer 80 detects the reflected wave input from the second input/output terminal 82 and the transmitted wave input from the first input/output terminal 81. The network analyzer 80 then measures the transmission coefficient (element $S_{12}$ of S-parameter) of the reverse voltage and the voltage reflection coefficient (element $S_{22}$ of S-parameter) on the output side, using the detected values of the reflected wave and transmitted wave and the incident wave. That is, when the incident wave, the reflected wave and the transmitted wave are given respectively as a2, b2 and b1, the network analyzer 80 measures the transmission coefficient ($S_{12}$) of the reverse voltage and the voltage reflection coefficient ($S_{22}$) on the output side, by calculating $S_{12}$=b1/a2, and $S_{22}$=b2/a2.

As a result of the above two types of measurement processing, the transmission coefficient ($S_{21}$) of the forward voltage, the transmission coefficient ($S_{12}$) of the reverse voltage, and the voltage reflection coefficient ($S_{22}$) on the output side that constitute the S-parameter "S(0,0)" with respect to the initial set of combination information (0,0) will be measured. The network analyzer 80 transmits the measured values of S-parameter "S(0,0)" from the control terminal 83 to the control unit 100 of the impedance adjustment apparatus 3A.

The control unit 100, on receiving the measured value of the S-parameter "S(0,0)", converts the S-parameter "S(0,0)" into the T-parameter "T(0,0)" using the above Equation 2. The control unit 100 then stores the resultant T-parameter "T(0,0)" in the memory 70 in association with the combination information (0,0).

Thereafter, the control unit 100 measures the S-parameter "S(C,F)" for each set of combination information (C,F) using the network analyzer 80, by successively changing the combination information (C,F) of the position of the movable portion of the variable capacitor 21 and the frequency of the high frequency output from the network analyzer 80. The control unit 100 measures the S-parameter "S(C,F)" corresponding to each set of combination information (C,F) using the network analyzer 80, while successively changing the sets of combination information (C,F) in an order such as the following: S(0,0), S(0,10), . . . , S(0,90), S(0,100), S(10,0), S(10,10), . . . , S(100,90), S(100,100). It should be obvious that the order in which measurement is performed is not limited to this order. The control unit 100 converts the measured value into a T-parameter "T(C,F)" every time an S-parameter "S(C,F)" for a combination information set (C,F) is measured by the network analyzer 80, and stores the resultant T-parameter in the memory 70 in association with the combination information (C,F).

Note that, in the above measurement procedure, every time an S-parameter is measured, processing for converting the S-parameter into a T-parameter is performed, but the measurement procedure is not limited thereto, and a configuration may be adopted in which conversion into a T-parameter is performed every plurality of S-parameters that are measured. Also, a configuration may be adopted in which the S-parameters for all sets of combination information (C,F) serving as measurement targets are first measured, before collectively converting the measured values of the S-parameters into T-parameters. For this purpose, both a memory for S-parameters, and a memory for T-parameters can be provided if needed.

Also, a configuration may be adopted in which the data of the S-parameters or T-parameters is output to a display (not shown) of the network analyzer 80 or a display, a printer (all not shown) or the like provided outside of the impedance adjustment apparatus 3A. It should be obvious that this data may be output to various external apparatuses (not shown).

[Operation of Impedance Adjustment Apparatus 3A]

Next, the impedance matching operation of the impedance adjustment apparatus 3A that is actually used as a high frequency power supply system will be described with reference to FIG. 6.

Figure 6:
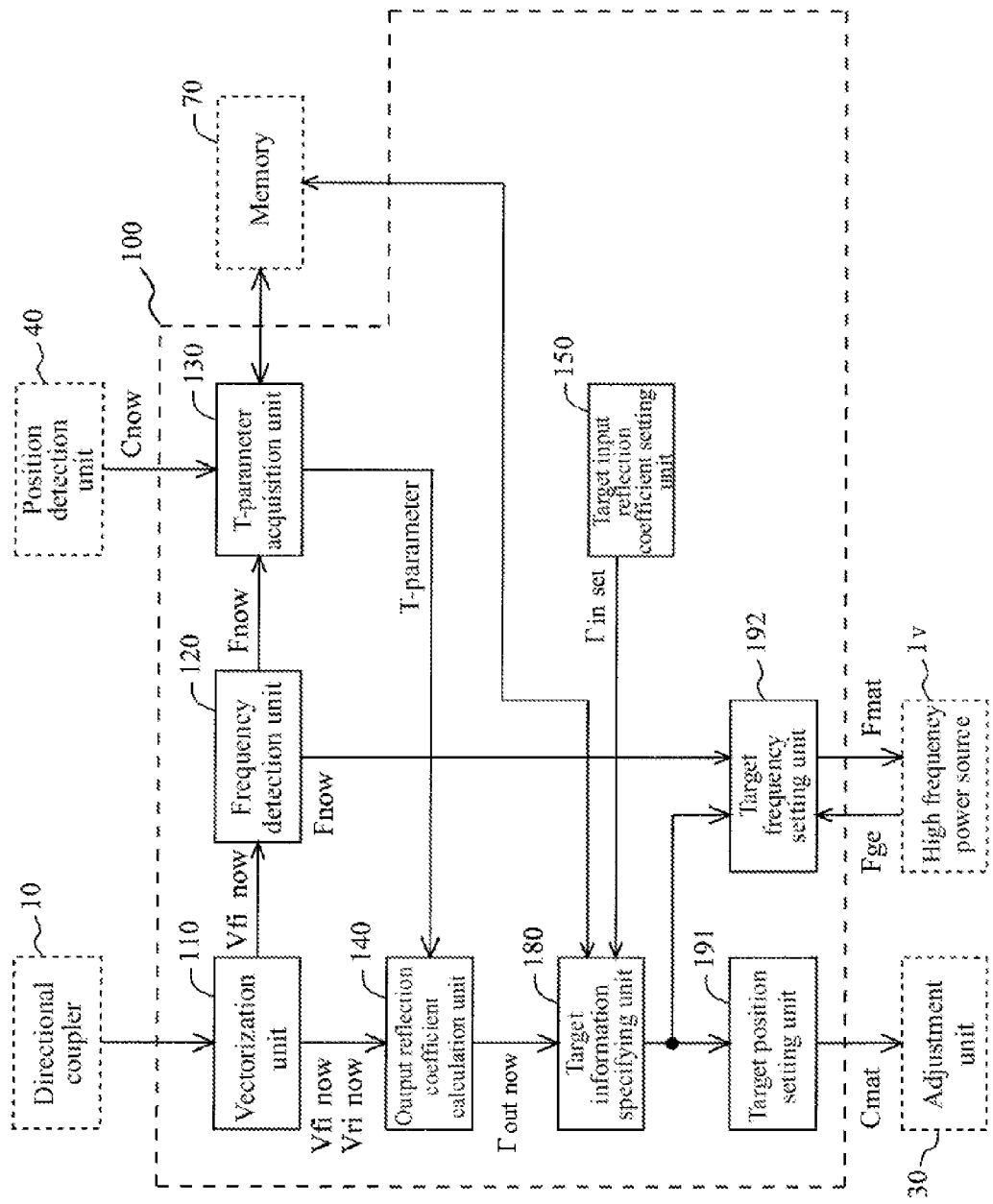
FIG. 6 is a functional block diagram of a control unit.

FIG. 6 is a functional block diagram of the control unit 100. The control unit 100 is, from a functional viewpoint, constituted by a vectorization unit 110, a frequency detection unit 120, a T-parameter acquisition unit 130, an output reflection coefficient calculation unit 140, a target input reflection coefficient setting unit 150, a target information specifying unit 180, a target position setting unit 191, and a target frequency setting unit 192, as shown in FIG. 6. The traveling wave voltage and reflected wave voltage that are output from the directional coupler 10 are input to the vectorization unit 110. The position information of the movable portion of the variable capacitor 21 that is output from the position detection unit 40 is input to the T-parameter acquisition unit 130. The power source recognition output frequency $F_{ge}$ that is output from the high frequency power source 1v is input to the target frequency setting unit 192. The output frequency information $F_{mat}$ that is output from the control unit 100 to the high frequency power source 1v is generated by the target frequency setting unit 192, and the command signal (target position information $C_{mat}$ discussed later) that is output from the control unit 100 to the adjustment unit 30 is generated by the target position setting unit 191.

Note that the frequency detection unit 120 is an example of an output frequency acquisition unit or frequency detection unit of the present invention, and the T-parameter acquisition unit 130 is an example of a characteristic parameter acquisition unit of the present invention. Also, the output reflection coefficient calculation unit 140 is an example of an output reflection coefficient calculation unit of the present invention, and the target information specifying unit 180 is an example of a specifying unit of the present invention. Also, the target frequency setting unit 192 is an example of a command signal output unit of the present invention.

Note that the control unit 100 periodically repeats the impedance matching operation during the period from the start to the end of plasma processing, and performs control such that the impedance of the high frequency power source 1v and the impedance of the load 5 are matched. Hereinafter, the processing from the start to the end of the impedance matching operation that is performed by the control unit 100 will be described in detail. Also, in the following description, the point in time when each impedance matching operation is started will be called the "current point in time".

The vectorization unit 110 is provided with an A/D converter (not shown) that samples an analog signal at a predetermined interval and converts the analog signal into a digital signal. The vectorization unit 110 converts the traveling wave voltage and reflected wave voltage that are input from the directional coupler 10 into respective digital signals using the A/D converter, and generates a traveling wave voltage $Vfi_{now}$ that is represented by vector information including size and phase information from the traveling wave voltage after conversion, and a reflected wave voltage $Vri_{now}$ that is represented by vector information including size and phase information from the reflected wave voltage after conversion. The traveling wave voltage $Vfi_{now}$ and reflected wave voltage $Vri_{now}$ are the traveling wave voltage and the reflected wave voltage of the input end 301 at the current point in time.

In the case where a high frequency detector is used instead of the directional coupler 10, the vectorization unit 110 is provided with an A/D converter that converts the high frequency voltage and high frequency current output from the high frequency detector into respective digital signals. The vectorization unit 110 generates the traveling wave voltage $Vfi_{now}$ and the reflected wave voltage $Vri_{now}$ by a well-known method, using the high frequency voltage and the high frequency current that were converted into digital signals.

In this case, a portion that includes the high frequency detector and a part that derives the traveling wave voltage $Vfi_{now}$ and the reflected wave voltage $Vri_{now}$ based on detection signals of the high frequency detector is an example of a high frequency information detection unit of the present invention.

The traveling wave voltage $Vfi_{now}$ at the current point in time generated by the vectorization unit 110 is input to the output reflection coefficient calculation unit 140 and the frequency detection unit 120, and the reflected wave voltage $Vri_{now}$ at the current point in time generated by the vectorization unit 110 is input to the output reflection coefficient calculation unit 140.

As shown in Equation 8, a reflection coefficient $\Gamma in_{now}$ (hereinafter, input reflection coefficient $\Gamma in_{now}$) of the input end 301 at the current point in time can be obtained, by dividing the reflected wave voltage $Vri_{now}$ by the traveling wave voltage $Vfi_{now}$. Note that the absolute value of the input reflection coefficient $\Gamma in_{now}$ (input reflection coefficient absolute value) is $|\Gamma in_{now}|$.

$$\Gamma \text{ in now} = \frac{Vri \text{ now}}{Vfi \text{ now}} \quad \langle\text{Equation 8}\rangle$$

The frequency detection unit 120 detects the output frequency $F_{now}$ at the current point in time of the high frequency wave that is output from the high frequency power source 1v by a well-known frequency detection method, using the traveling wave voltage $Vfi_{now}$ input from the vectorization unit 110. The output frequency $F_{now}$ at the current point in time detected by the frequency detection unit 120 is input to the T-parameter acquisition unit 130 and the target frequency setting unit 192. Note that well-known frequency detection methods include, for example, a frequency detection method that uses PLL (phase-locked loop) and a frequency detection method that uses zero crossing. It should be obvious that the frequency detection method is not limited to these frequency detection methods, and other frequency detection methods may be used.

In the case where a high frequency detector is used instead of the directional coupler 10, the detected value of the high frequency voltage can be input from the high frequency detector to the frequency detection unit 120, for example, and the output frequency $F_{now}$ at the current point in time of the high frequency wave that is output from the high frequency power source 1v can be detected by the frequency detection unit 120 using the detected values of the high frequency voltage.

As described above, the S-parameters used in the present embodiment are parameters that are measured while matching the frequency of the high frequency wave that is output from the network analyzer 80 to the output frequency of the high frequency output from the high frequency power source 1v. For this reason, the difference between the output frequency $F_{now}$ at the current point in time detected by the frequency detection unit 120 and the frequency of the high frequency output from the network analyzer 80 at the time that an S-parameter is measured needs to be reduced as much as possible.

From a similar viewpoint, the difference between the power source recognition output frequency $F_{ge}$, that is input from the high frequency power source 1v to the control unit 100 and the output frequency $F_{now}$ at the current point in time that is detected by the frequency detection unit 120 needs to be reduced as much as possible. If the manufacturer of the high frequency power source 1v is the same as the manufacturer of the impedance adjustment apparatus 3A, the difference between the power source recognition output frequency $F_{ge}$, and the output frequency $F_{now}$ can be reduced as much as possible. However, in the case where the manufacturer of the high frequency power source 1v differs from the manufacturer of the impedance adjustment apparatus 3A, a difference could possibly occur between the power source recognition output frequency $F_{ge}$ and the output frequency $F_{now}$, preventing accurate impedance matching from being performed. For this reason, in the present embodiment, a configuration is adopted in which the output frequency of the high frequency wave that is output from the high frequency power source 1v is detected by the control unit 100 of the impedance adjustment apparatus 3A.

It should be obvious that in the case where the power source recognition output frequency $F_{ge}$ and the output frequency $F_{now}$ at the current point in time are almost the same, a configuration can be adopted in which the frequency detection unit 120 is omitted, and the power source recognition output frequency $F_{ge}$ that is input from the high frequency power source 1v to the control unit 100 is input to the T-parameter acquisition unit 130 provided in the control unit 100.

The T-parameter acquisition unit 130 acquires a T-parameter corresponding to the combination of position information $C_{now}$ at the current point in time that is input from the position detection unit 40 and an output frequency $F_{now}$ at the current point in time that is input from the frequency detection unit 120, using the T-parameters stored in the memory 70, and inputs the acquired T-parameter to the output reflection coefficient calculation unit 140.

The T-parameter acquisition unit 130, in the case where the T-parameter corresponding to the combination of the position information $C_{now}$ and the output frequency $F_{now}$ at the current point in time is stored in the memory 70, reads that T-parameter from the memory 70, and inputs the read T-parameter to the output reflection coefficient calculation unit 140. In the case where the T-parameter corresponding to the combination of position information $C_{now}$ and the output frequency $F_{now}$ at the current point in time is not stored in the memory 70, the T-parameter acquisition unit 130 computes the T-parameter corresponding to the combination of the position information $C_{now}$ and the output frequency $F_{now}$ at the current point in time by the abovementioned interpolation operation, using the T-parameters stored in the memory 70, and inputs the computed value to the output reflection coefficient calculation unit 140.

The output reflection coefficient calculation unit 140 calculates a traveling wave voltage $Vfo_{now}$ and a reflected wave voltage $Vro_{now}$ of the output end 302 at the current point in time, based on the traveling wave voltage $Vfi_{now}$ and the reflected wave voltage $Vri_{now}$ of the input end 301 at the current point in time that are input from the vectorization unit 110 and the T-parameter corresponding to the combination of the position information $C_{now}$ and the output frequency $F_{now}$ at the current point in time that is input from the T-parameter acquisition unit 130. The output reflection coefficient calculation unit 140 calculates the traveling wave voltage $Vfo_{now}$ and the reflected wave voltage $Vro_{now}$ of the output end 302 at the current point in time with Equation 9 shown below.

$$\begin{bmatrix} Vfo \text{ now} \\ Vro \text{ now} \end{bmatrix} = \begin{bmatrix} T_{11} \text{ now} & T_{12} \text{ now} \\ T_{21} \text{ now} & T_{22} \text{ now} \end{bmatrix} \begin{bmatrix} Vfi \text{ now} \\ Vri \text{ now} \end{bmatrix} \quad \langle\text{Equation 9}\rangle$$

$Vfo$ now $= T_{11}$ now$\cdot Vfi$ now $+ T_{12}$ now$\cdot Vri$ now $Vro$ now $= T_{21}$ now$\cdot Vfi$ now $+ T_{22}$ now$\cdot Vri$ now Note that, in Equation 9, $T_{11now}$, $T_{12now}$, $T_{21now}$ and $T_{22now}$ are elements constituting the T-parameter input from the T-parameter acquisition unit 130; that is, elements of the T-parameter corresponding to the combination of the position of the movable portion of the variable capacitor 21 and the output frequency of the high frequency power source 1v at the current point in time.

Also, the output reflection coefficient calculation unit 140 calculates a reflection coefficient $\Gamma\text{out}_{now}$ (hereinafter, output reflection coefficient $\Gamma\text{out}_{now}$) of the output end 302 at the current point in time, by dividing the reflected wave voltage $\text{Vro}_{now}$ of the output end 302 at the current point in time by the traveling wave voltage $\text{Vfo}_{now}$, as shown in Equation 10. The calculation result is sent to the target information specifying unit 180.

$$\Gamma \text{ out now} = \frac{\text{Vro now}}{\text{Vfo now}} \quad \text{(Equation 10)}$$

Note that output reflection coefficient $\Gamma\text{out}_{now}$ at the current point in time can also be calculated by the following Equation 11 using the T-parameter.

$$\Gamma \text{ out now} = \frac{T_{21} \text{ now} + T_{22} \text{ now} \cdot \Gamma \text{ in now}}{T_{11} \text{ now} + T_{12} \text{ now} \cdot \Gamma \text{ in now}} \quad \text{(Equation 11)}$$

The target input reflection coefficient setting unit 150 sets an input reflection coefficient $\Gamma\text{in}_{set}$ (hereinafter, "target input reflection coefficient $\Gamma\text{in}_{set}$") that serves as a target in advance. This target input reflection coefficient $\Gamma\text{in}_{set}$ can be represented by Equation 12. The target input reflection coefficient setting unit 150 inputs the set target input reflection coefficient $\Gamma\text{in}_{set}$ to the target information specifying unit 180.

$$\Gamma \text{ in set} = \frac{Zin - Zo}{Zin + Zo} \quad \text{(Equation 12)}$$

In Equation 12, $Z_{in}$ is the target impedance, and is represented by $Z_{in}=R_{in}+jX_{in}$ which is the sum of the real part $R_{in}$ and the imaginary part Xin. Also, $Z_o$ is the characteristic impedance. Note that the target input reflection coefficient setting unit 150 may set the target input reflection coefficient $\Gamma\text{in}_{set}$ directly, or a configuration may be adopted in which the target impedance $Z_{in}$ and the characteristic impedance $Z_o$ are set in the target input reflection coefficient setting unit 150 in advance, and the target input reflection coefficient setting unit 150 sets the target input reflection coefficient $\Gamma\text{in}_{set}$ by calculating Equation 12 with the set target impedance $Z_{in}$ and characteristic impedance $Z_o$.

The target input reflection coefficient $\Gamma\text{in}_{set}$ is usually a minimum value, that is, 0 ($\Gamma\text{in}_{set}=0+j0$ in the case where the target input reflection coefficient $\Gamma\text{in}_{set}$ is represented by the sum of the real part and the imaginary part), but may be set a value other than 0 that can be regarded as being matched. For example, the target input reflection coefficient $\Gamma\text{in}_{set}$ may be set to the relatively small value such as 0.05 or 0.1. In the case where the target input reflection coefficient $\Gamma\text{in}_{set}$ is set to 0, an impedance matching state where the reflected wave of the input end 301 is a minimum value (i.e., 0) can be achieved when the input reflection coefficient $\Gamma\text{in}$ becomes the target input reflection coefficient $\Gamma\text{in}_{set}$ by adjusting the position of the movable portion of the variable capacitor 21 and the output frequency of the high frequency power source 1v at the time.

Although the target input reflection coefficient setting unit 150 may also set the desired target input reflection coefficient $\Gamma\text{in}_{set}$ in advance, a configuration may be adopted in which a setting unit for setting the target input reflection coefficient $\Gamma\text{in}_{set}$ in the target input reflection coefficient setting unit 150 is provided to enable the target input reflection coefficient $\Gamma\text{in}_{set}$ to be changed at any time.

The relationship between the target input reflection coefficient $\Gamma\text{in}_{set}$, output reflection coefficient $\Gamma\text{out}_{now}$ at the current point in time and the T-parameter is represented as in Equation 13.

$$\Gamma \text{ out now} = \frac{T_{21} \text{ mat} + T_{22} \text{ mat} \cdot \Gamma \text{ in set}}{T_{11} \text{ mat} + T_{12} \text{ mat} \cdot \Gamma \text{ in set}} \quad \text{(Equation 13)}$$

In Equation 13, $T_{11mat}$, $T_{12mat}$, $T_{21mat}$ and $T_{22mat}$ are elements of the T-parameter corresponding to the combination information of the position of the movable portion of the variable capacitor 21 and the output frequency of the high frequency power source 1v that is able to set the reflection coefficient of the input end 301 to the target input reflection coefficient $\Gamma\text{in}_{set}$, when the reflection coefficient of the output end 302 is the output reflection coefficient $\Gamma\text{out}_{now}$ at the current point in time.

Equation 13 can be derived as follows. The output reflection coefficient $\Gamma\text{out}_{now}$ at the current point in time can be derived by Equation 10 or Equation 11. Also, the traveling wave voltage $\text{Vfo}_{now}$ and the reflected wave voltage $\text{Vro}_{now}$ of the output end 302 at the current point in time are represented by $\text{Vfo}_{now}=T_{11mat}\cdot\text{Vfi}_{now}+T_{12mat}\cdot\text{Vri}_{now}$ and $\text{Vro}_{now}=T_{21mat}\cdot\text{Vfi}_{now}+T_{12mat}(\text{Vri}_{now}$ and $\text{Vri}_{now}$ are the traveling wave voltage and the reflected wave voltage of the input end 301 at the current point in time, if the T-parameter is taken into consideration with reference to Equation 9. Accordingly, $\Gamma\text{out}_{now}=(T_{21mat}\cdot\text{Vfinow}+T_{22mat}\cdot\text{Vri}_{now})/(T_{11mat}\cdot\text{Vfi}_{now}+T_{12mat}\cdot\text{Vri}_{now})$. Here, because the input reflection coefficient $\Gamma\text{in}_{set}=\text{Vri}_{now}/\text{Vfi}_{now}$, $\Gamma\text{out}_{now}=[T_{21mat}\cdot\text{Vfi}_{now}+T_{22mat}\cdot(\Gamma\text{in}_{set}\cdot\text{Vfi}_{now})]/[T_{11mat}\cdot\text{Vfi}_{now}+T_{12mat}\cdot(\Gamma\text{in}_{set}\cdot\text{Vfi}_{now})]=(T_{21mat}+T_{22mat}\cdot\Gamma\text{in}_{set})/(T_{11mat}+T_{12mat}\cdot\Gamma\text{in}_{set})$.

According to Equation 13, if the four elements ($T_{11mat}$, $T_{12mat}$, $T_{21mat}$, $T_{22mat}$) of the T-parameter of the impedance adjustment apparatus 3A can be adjusted such that Equation 13 is true, with respect to the output reflection coefficient $\Gamma\text{out}_{now}$ at the current point in time computed by the output reflection coefficient calculation unit 140, it is known that the input reflection coefficient $\Gamma\text{in}$ of the input end 301 of the impedance adjustment circuit 3P can be set to the target input reflection coefficient $\Gamma\text{in}_{set}$ of the input end 301 of the impedance adjustment circuit 3P.

If the four elements ($T_{11mat}$, $T_{12mat}$, $T_{21mat}$, $T_{22mat}$) of a T-parameter can each be adjusted freely, a T-parameter ($T_{11mat}$, $T_{12mat}$, $T_{21mat}$, $T_{22mat}$) for which Equation 13 is true can be derived.

However, because the T-parameter is a parameter representing transmission characteristics at the time of treating the entire impedance adjustment apparatus 3A as a transmission apparatus, and four elements are measured as one set every combination of a position of the movable portion of the variable capacitor 21 and an output frequency of the high frequency power source 1v, there is little possibility that a virtual output reflection coefficient $\Gamma\text{out}_{now}'$ that matches the output reflection coefficient $\Gamma\text{out}_{now}$ at the current point in time will be obtained.

The virtual output reflection coefficient $\Gamma\text{out}_{now}'$ is represented by Equation 14, where the result of respectively substituting a plurality of the T-parameters measured in advance such as shown in Table 3 or a plurality of parameters that are estimated by interpolation from T-parameters measured in advance into the right side of Equation 13 is taken as the virtual output reflection coefficient $\Gamma out_{now}'$.

$$\Gamma \ out \ now' \ (C, F) = \qquad \langle \text{Equation 14} \rangle$$

$$\frac{T_{21} \ mat (C, F) + T_{22} \ mat \ (C, F) \cdot \Gamma \ in \ set}{T_{11} \ mat \ (C, F) + T_{12} \ mat \ (C, F) \cdot \Gamma \ in \ set}$$

In Equation 14, $T_{11mat}(c, F)$, $T_{12mat}(c, F)$, $T_{21mat}(c, F)$ and $T_{22mat}(c,F)$ indicate elements of the T-parameter "T(C,F)" corresponding to the combination information (C,F), and $\Gamma out_{now}'(C,F)$ indicates the virtual output reflection coefficient corresponding to combination information (C,F).

Although a plurality of virtual output reflection coefficients $\Gamma out_{now}'(C, F)$ are obtained as a result of the calculation of Equation 14, there is little possibility that a virtual output reflection coefficient $\Gamma out_{now}'(C,F)$ that matches the output reflection coefficient $\Gamma out_{now}$ at the current point in time will be obtained, as described above.

However, a combination of the position of the movable portion of the variable capacitor 21 and the output frequency of the high frequency power source 1v that most closely approximates the conditions under which Equation 13 is true can be specified, if the calculated virtual output reflection coefficients $\Gamma out_{now}'(C,F)$ are searched for a virtual output reflection coefficient $\Gamma out_{now}'(C,F)$ most closely approximately the output reflection coefficient $\Gamma outn_{now}$ at the current point in time (hereinafter, approximate reflection coefficient $\Gamma out_{now}''$ (C, F)). Because the target input reflection coefficient $\Gamma in_{set}$ is set to be less than or equal to a value that can be regarded matched, as described above, the impedance can be regarded as matched if an output reflection coefficient $\Gamma out$ of the impedance adjustment apparatus 3A can be set as the approximate reflection coefficient $\Gamma out_{now}''(C,F)$.

In the case where T-parameters are not acquired for all sets of combination information (C,F) of the position of the movable portion of the variable capacitor 21 and the output frequency of the high frequency power source 1v, as shown in Table 3, a combination information set (C,F) of the position of the movable portion of the variable capacitor 21 and the output frequency of the high frequency power source 1v that most closely approximates the conditions under which Equation 13 is true cannot be accuracy specified.

However, even if T-parameters (S-parameters) are not acquired for all sets of combination information (C,F), combination information of the position of the movable portion of the variable capacitor 21 and the output frequency of the high frequency power source 1v that most closely approximates (as close as possible) the conditions under which Equation 13 is true can be specified through calculations. This specification operation is performed in the target information specifying unit 180.

Note that, in the present specification, the combination information that most closely approximates the conditions under which Equation 13 is true is referred to as "target combination information (Cz, Fz)". Also, in the case where S-parameters are acquired for sets of combination information (C,F) in a grid as shown in FIG. 2, for example, values obtained by converting those S-parameters are described as acquired T-parameters. Note that, as described above, T-parameters converted from S-parameters derived by interpolation can be included in the acquired T-parameters. Hereinafter, the procedure of specifying target combination information (Cz, Fz) in the target information specifying unit 180 will be described.

First, the method of specifying target combination information (Cz, Fz) will be described.

The relationship shown in Equation 15 is obtained by respectively substituting $T_{11mat}$, $T_{12mat}$, $T_{21mat}$ and $T_{22mat}$ of Equation 13 for the four elements $T_{11}$, $T_{12}$, $T_{21}$ and $T_{22}$ shown in Equation 7.

⟨Equation 15⟩

$$\Gamma out_{now} = \frac{T_{21mat} + T_{22mat} \Gamma in_{set}}{T_{11mat} + T_{12mat} \Gamma in_{set}}$$

$$T_{21mat} + \Gamma in_{set} T_{22mat} - \Gamma out_{now}(T_{11mat} + \Gamma in_{set} T_{12mat}) = 0$$

$$T_{21}(n_c c_0, n_f f_0) + \Gamma in_{set} T_{22}(n_c c_0, n_f f_0) - \Gamma out_{now}[T_{11}(n_c c_0, n_f f_0) + \Gamma in_{set} T_{22}(n_c c_0, n_f f_0)] +$$

$$\left\{ \begin{array}{l} T_{21}[(n_c+1)c_0, n_f f_0] - T_{21}(n_c c_0, n_f f_0) + \\ \Gamma in_{set} \{T_{22}[(n_c+1)c_0, n_f f_0] - T_{22}(n_c c_0, n_f f_0)\} - \\ \Gamma out_{now} \left\{ \begin{array}{l} T_{11}[(n_c+1)c_0, n_f f_0] - T_{11}(n_c c_0, n_f f_0) + \\ \Gamma in_{set} \{T_{12}[(n_c+1)c_0, n_f f_0] - T_{12}(n_c c_0, n_f f_0)\} \end{array} \right\} \end{array} \right\} d_c +$$

$$\left\{ \begin{array}{l} T_{21}[n_c c_0, (n_f+1)f_0] - T_{21}(n_c c_0, n_f f_0) + \\ \Gamma in_{set} \{T_{22}[n_c c_0, (n_f+1)f_0] - T_{22}(n_c c_0, n_f f_0)\} - \\ \Gamma out_{now} \left\{ \begin{array}{l} T_{11}[n_c c_0, (n_f+1)f_0] - T_{11}(n_c c_0, n_f f_0) + \\ \Gamma in_{set} \{T_{12}[n_c c_0, (n_f+1)f_0] - T_{12}(n_c c_0, n_f f_0)\} \end{array} \right\} \end{array} \right\} d_f +$$

$$\left\{ \begin{array}{l} T_{21}(n_c c_0, n_f f_0) - T_{21}[(n_c+1)c_0, n_f f_0] - T_{21}[n_c c_0, (n_f+1)f_0] + \\ T_{21}[(n_c+1)c_0, (n_f+1)f_0] + \Gamma in_{set} \left\{ \begin{array}{l} T_{22}(n_c c_0, n_f f_0) - T_{22}[(n_c+1)c_0, n_f f_0] - \\ T_{22}[n_c c_0, (n_f+1)f_0] + T_{22}[(n_c+1)c_0, (n_f+1)f_0] \end{array} \right\} - \\ \Gamma out_{new} \left\{ \begin{array}{l} T_{11}(n_c c_0, n_f f_0) - T_{11}[(n_c+1)c_0, n_f f_0] - \\ T_{11}[n_c c_0, (n_f+1)f_0] + T_{11}[(n_c+1)c_0, (n_f+1)f_0] + \\ \Gamma in_{set} \left\{ \begin{array}{l} T_{12}(n_c c_0, n_f f_0) - T_{12}[(n_c+1)c_0, n_f f_0] - \\ T_{12}[n_c c_0, (n_f+1)f_0] + T_{12}[(n_c+1)c_0, (n_f+1)f_0] \end{array} \right\} \end{array} \right\} \end{array} \right\} d_c d_f = 0$$

Substituting Equation 16 into Equation 15 gives Equation 17. With these equations, it is only the first time and when the target input reflection coefficient rinse-t is changed that it is possible to perform calculations for all combinations of $n_c$ and $n_f$ and to store the results in a memory (not shown).

Note that, in Equation 17, $A_1, A_2, B_1, B_2, C_1, C_2, D_1$ and $D_2$ have been partially omitted, in order to simplify notation. For example, A1 denotes A1 ($n_c$, $n_f$, Γinset).

⟨Equation 16⟩

$$A_1(n_c, n_f, \Gamma in_{set}) = T_{21}(n_c, c_0, n_f f_0) + \Gamma in_{set} T_{22}(n_c c_0, n_f f_0)$$

$$A_2(n_c, n_f, \Gamma in_{set}) = T_{11}(n_c c_0, n_f f_0) + \Gamma in_{set} T_{12}(n_c c_0, n_f f_0)$$

$$B_1(n_c, n_f, \Gamma in_{set}) = T_{21}[(n_c+1)c_0, n_f f_0] - T_{21}(n_c c_0, n_f f_0) + \Gamma in_{set}\{T_{22}[(n_c+1)c_0, n_f f_0] - T_{22}(n_c c_0, n_f f_0)\}$$

$$B_2(n_c, n_f, \Gamma in_{set}) = T_{11}[(n_c+1)c_0, n_f f_0] - T_{11}(n_c c_0, n_f f_0) + \Gamma in_{set}\{T_{12}[(n_c+1)c_0, n_f f_0] - T_{12}(n_c c_0, n_f f_0)\}$$

$$C_1(n_c, n_f, \Gamma in_{set}) = T_{21}[n_c c_0, (n_f+1)f_0] - T_{21}(n_c c_0, n_f f_0) + \Gamma in_{set}\{T_{22}[n_c c_0, (n_f+1)f_0] - T_{22}(n_c c_0, n_f f_0)\}$$

$$C_2(n_c, n_f, \Gamma in_{set}) = T_{11}[n_c c_0, (n_f+1)f_0] - T_{11}(n_c c_0, n_f f_0) + \Gamma in_{set}\{T_{12}[n_c c_0, (n_f+1)f_0] - T_{12}(n_c c_0, n_f f_0)\}$$

$$D_1(n_c, n_f, \Gamma in_{set}) = T_{21}(n_c c_0, n_f f_0) - T_{21}[(n_c+1)c_0, n_f f_0] - T_{21}[n_c c_1, (n_f+1)f_0] + T_{21}[(n_c+1)c_0, (n_f+1)f_0] + \Gamma in_{set}\{T_{22}(n_c c_0, n_f f_0) - T_{22}[(n_c+1)c_0, n_f f_0] - T_{22}[n_1 c_0, (n_f+1)f_0] + T_{22}[(n_c+1)c_0, (n_f+1)f_0]\}$$

$$D_2(n_c, n_f, \Gamma in_{set}) = T_{11}(n_c c_0, n_f f_0) - T_{11}[(n_c+1)c_0, n_f f_0] - T_{11}[n_c c_0, (n_f+1)f_0] + T_{11}[(n_c+1)c_0, (n_f+1)f_0] + \Gamma in_{set}\{T_{12}(n_c c_0, n_f f_0) - T_{12}[(n_c+1)c_0, n_f f_0] - T_{12}[n_c c_0, (n_f+1)f_0] + T_{12}[(n_c+1)c_0, (n_f+1)f_0]\}$$

⟨Equation 17⟩

$$A1 - \Gamma out_{now} A2 + (B1 - \Gamma out_{now} B2)dc + (C1 - \Gamma out_{now} C2)df + (D1 - \Gamma out_{now} D2)dcdf = 0$$

Further substituting Equation 18 into Equation 17 gives Equation 19. Note that, in Equation 19, A, B, C and D have been partially omitted, in order to simplify notation. For example, A denotes A($n_c$, $n_f$, Γ$in_{set}$, Γ$out_{now}$).

$$A(nc, nf, \Gamma in_{set}, \Gamma out_{now}) = A1 - \Gamma out_{now} A2$$

$$B(nc, nf, \Gamma in_{set}, \Gamma out_{now}) = B1 - \Gamma out_{now} B2$$

$$C(nc, nf, \Gamma in_{set}, \Gamma out_{now}) = C1 - \Gamma out_{now} C2$$

$$D(nc, nf, \Gamma in_{set}, \Gamma out_{now}) = D1 - \Gamma out_{now} D2 \quad \text{<Equation 18>}$$

$$A + Bdc + Cdf + Ddcdf = 0 \quad \text{<Equation 19>}$$

The equation shown in Equation 20 can be obtained when Equation 19 is divided into the real part and the imaginary part to derive $d_c$ and $d_f$.

⟨Equation 20⟩

$$\{Re(B)Im(D) - Re(D)Im(B)\}d_c^2 + \left\{\begin{array}{l} Re(A)Im(D) - Re(D)Im(A) + \\ Re(B)Im(C) - Re(C)Im(B) \end{array}\right\}d_c + Re(A)Im(C) - Re(C)Im(A) = 0$$

$$d_c = \frac{-[Re(A)Im(D) - Re(D)Im(A) + Re(B)Im(C) - Re(C)Im(B)] \pm \sqrt{\begin{array}{l}[Re(A)Im(D) - Re(D)Im(A) + Re(B)Im(C) - Re(C)Im(B)]^2 - \\ 4\{[Re(B)Im(D) - Re(D)Im(B)][Re(A)Im(C) - Re(C)Im(A)]\}\end{array}}}{2[Re(B)Im(D) - Re(D)Im(B)]}$$

$$d_f = -\frac{Re(A) + Re(B)d_c}{Re(C) + Re(D)d_c}$$

Note that, in Equation 19, if A=Re(A)+Im(A), B=Re(B)+Im(B), C=Re(C)+Im(C) and D=Re(D)+Im(D), the real part and the imaginary part of the left side of Equation 19 are 0, thus giving:

$$Re(A)+Re(B)d_c+Re(C)df+Re(D)d_c d_f=0$$

$$Im(A)+Im(B)d_c+Im(C)df+Im(D)d_c d_f=0$$

Deriving $d_f$ from these equations gives:

$$d_f=-(Re(A)+Re(B)d_c)/(Re(C)+Re(D)d_c)$$

$$d_f=-(Im(A)+Im(B)d_c)/(Im(C)+Im(D)d_c)$$

Thus, the following is obtained from these two equations:

$$(Re(A)+Re(B)d_c)-(Im(C)+Im(D)d_c)=(Re(C)+Re(D)d_c)-(Im(A)+Im(B)d_c)$$

Transforming this equation gives the quadratic equation of $d_c$ shown in Equation 20, and the equation of $d_c$ shown in Equation 20 is obtained from the solution equation of this quadratic equation.

Because of the relationships shown in Equations 15 to 20, the target combination information (Cz, Fz) can be derived by deriving $d_c$ (decimal part of C/$c_0$) and $d_f$ (decimal part of C/$c_0$) from the equation of $d_c$ and $d_f$ shown in Equation 20, in all combinations of $n_c$ (integer part of C/$c_0$) and $n_f$ (integer part of F/$f_0$), and extracting the combinations in which $d_c$ and $d_f$ are respectively between 0 and 1. The target combination information (Cz, Fz) is represented by $[(n_c+d_c)c_0, f(n_f+d_f)f_0]$ (0<$d_c$<1, 0<$d_f$<1).

Next, the procedure for deriving target combination information (Cz, Fz) will be described.

Referring to Equations 15 and 16, it is known that $d_c$ and $d_f$ in an arbitrary combination ($n_c$, $n_f$) are derived using the T-parameters of four types of combinations $n_c c_0$, $c(n_c+1)_0$, $n_f f_0$ and $f(n_f+1)_0$.

For example, because ($n_c+1$, $n_f$)=(1,0), =($n_c$, $n_f+1$)=(0,1) and ($n_c+1$, $n_f+1$)=(1,1) when ($n_c$, $n_f$)=(0,0), $d_c$ and $d_f$ are derived using the four T-parameters of the combinations (0,0), ($c_0$, 0), (0, $f_0$) and ($c_0$, $f_0$). At this time, if the data intervals $n_0$ and $n_f$ of known T-parameters are respectively 10 as shown in FIG. 2, $d_c$ and $d_f$ are derived using the four T-parameters T(0,0), T(10,0), T(0,10) and T(10,10).

Also, when ($n_c$, $n_f$)=(1,0), $d_c$ and $d_f$ are similarly derived using the four T-parameters T(10,0), T(20,0), T(10,10) and T(20,10).

Accordingly, $d_c$ and $d_f$ for all combinations ($n_c$, $n_f$) of $n_c$ and $n_f$ are derived by successively changing the values of the combinations of $n_c$ and $n_f$, and repeating processing for deriving $d_c$ and $d_f$ using the four T-parameters corresponding to each combination ($n_c$, $n_f$).

Note that in the case where T-parameters are acquired for combinations at grid points, as shown in FIG. 2, the ranges of $n_c$ and $n_f$ that is used in calculating $d_c$ and $d_f$ are respectively $n_c$=0-10, and $n_f$=0-10, but because $n_c$=10 is included in the four combinations including $n_c$=9 and $n_f$=10 is included in the four combinations including $n_f$=9, $n_c$ and $n_f$ can be respectively changed to values within the range 0-9 in the processing for successively changing the values of the combinations of $n_c$ and $n_f$.

Accordingly, if the maximum value of the variation range of $n_c$ is given as "$n_{cmax}$" and the maximum value of the variation range of $n_f$ is given as "$n_{fmax}$", $d_c$ and $d_f$ for all of the combinations of $n_c$ and $n_f$ can be derived by changing $n_c$ in a range of 0 to ($n_{cmax}$−1) and changing $n_f$ in a range of 0 to ($n_{fmax}$−1).

Figure 7:
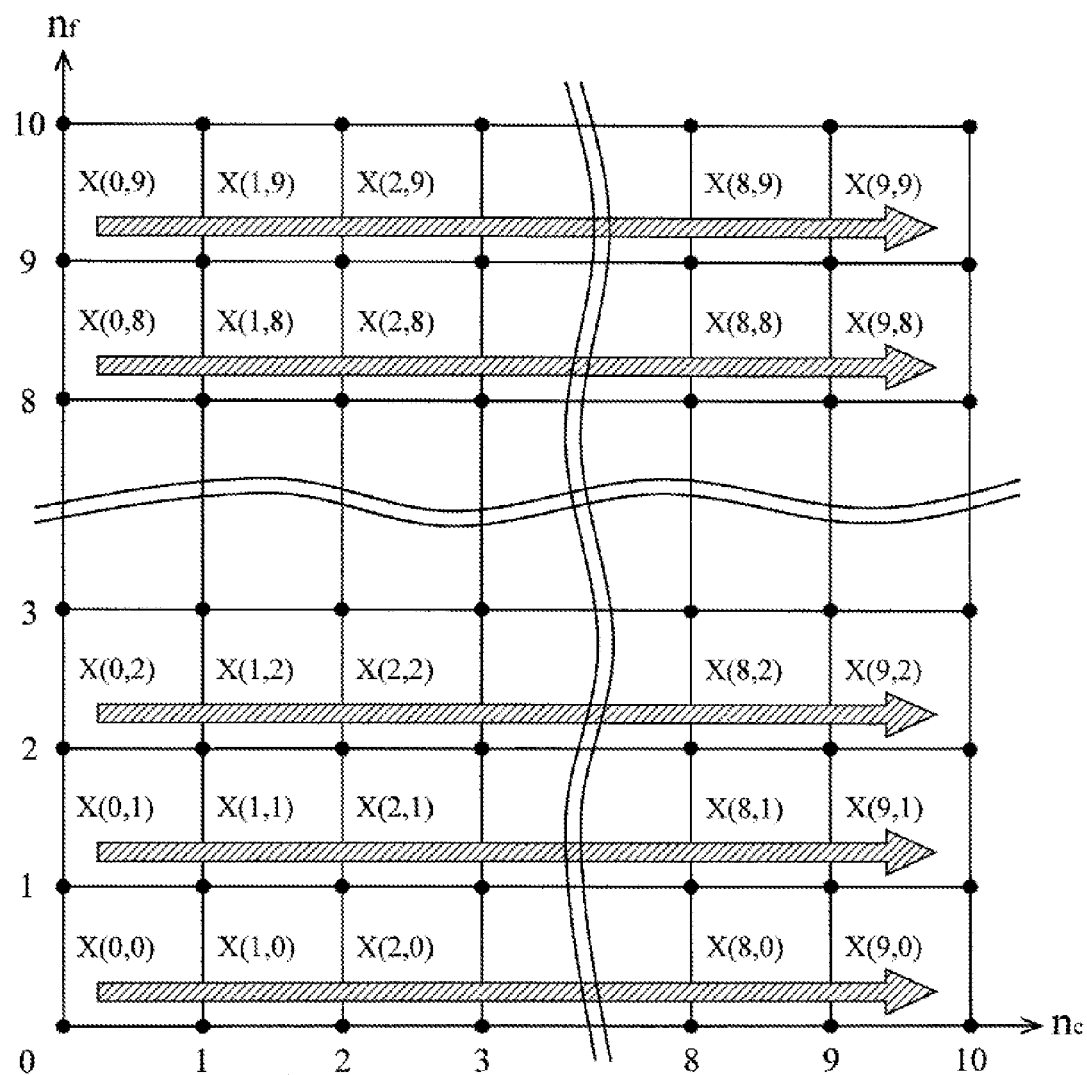
FIG. 7 is a diagram showing an example of a way of changing of a variable that is used in order to specify target combination information.
Figure 8:
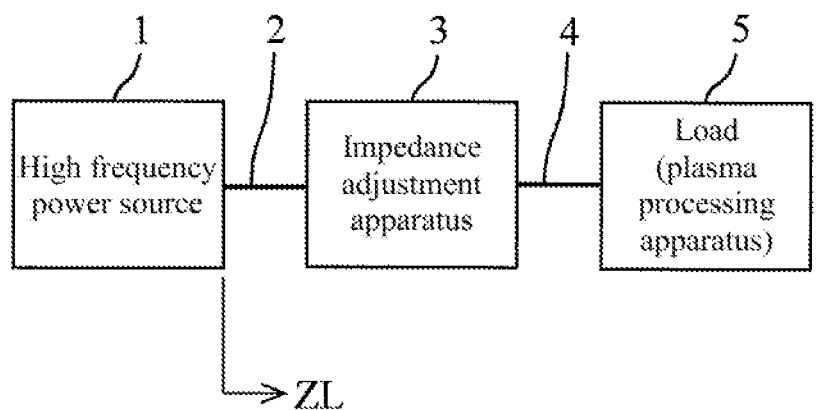
FIG. 8 is a diagram showing an exemplary configuration of a high frequency power supply system.

FIG. 7 is a diagram showing an exemplary way of changing the variables $n_c$ and $n_f$ that are used for specifying target combination information (Cz, Fz).

In FIG. 7, $n_c$ is set on the horizontal axis, $n_f$ is set on the vertical axis, and an area enclosed by four points of the combinations ($n_c$, $n_f$) of $n_c$ and $n_f$ is represented by X($n_c$, $n_f$). For example, when ($n_c$, $n_f$)=(0,0), the area X(0,0) is an area enclosed by the four points ($n_c$, $n_f$)=(0,0), (10,0), (0,10) and (10,10).

Accordingly, when the values of $n_c$ and $n_f$ are successively changed such that ($n_c$, $n_f$)=(0,0)→(1,0)→(2,0)...(8,0)→(9,0)→(0,1)→(1,1)→(2,1)...(8,1)→(9,1)→(0,2)→(1,2)→(2,2)...(8,9)→(9,9), for example, as shown by the arrows in FIG. 7, the area targeted for performing calculations changes such that X(0,0)→X(1,0)→X(2,0)...X(8,0)→X(9,0)→X(0,1)→X(1,1)→X(2,1)...X(8,1)→X(9,1)→X(0,2)→X(1,2)→X(2,2)...X(8,9)→X(9,9), thus enabling $d_c$ and $d_f$ to be derived for all combinations of the $n_c$ and $n_f$.

That is, as described above, if the values of $n_c$ and $n_f$ are changed in the ranges $n_c$=0 to ($nc_{max}$−1) and n=0 to ($nf_{max}$−1), $d_c$ and $d_f$ can be derived for all combinations of the $n_c$ and $n_f$.

It should be obvious that the way of changing of the values of the variables $n_c$ and $n_f$ is not limited to that described above, and the values of these variables may be changed in other ways.

In the case where $d_c$ and $d_f$ are derived using the equations of $d_c$ and $d_f$ shown in Equation 20, $d_c$ and $d_f$ will not take values between 0 and 1 in some cases. For example, in the case where ($n_c$, $n_f$)=(0,0), that is, in the case where an area "X(0,0)" is targeted, d and dr will not take values between 0 and 1 in some cases. In such cases, the target combination information (Cz, Fz) will exist outside the area "X(0,0)". In FIG. 7, the area "X(0,0)" is an area enclosed by the four points ($n_c$, $n_f$)=(0,0), (10,0), (0,10) and (10,10), but in the case where $d_c$ and $d_f$ do not take values between 0 and 1, the target combination information (Cz, Fz) will exist in another area rather than that area. In the case where $d_c$ and $d_f$ do not take values between 0 and 1 in the other area, the target combination information (Cz, Fz) will exist outside that area.

Errors also occur in $d_c$ and $d_f$ due to factors such as detection error in detecting the input reflection coefficient absolute value $|\Gamma in_{now}|$. This error tends to increase as input reflection coefficient absolute value $|\Gamma in_{now}|$ increases. Because the accuracy of the specified target combination information (Cz, Fz) will be low due to errors in $d_c$ and $d_f$ in a state where the input reflection coefficient absolute value $|\Gamma in_{now}|$ takes a large value, a configuration may be adopted in which the adjustment circuit 3A is adjusted to that target combination information (F) to reduce the input reflection coefficient absolute value $|\Gamma in_{now}|$, before again deriving $d_c$ and $d_f$ and specifying the target combination information (Cz, Fz).

Also, it is conceivable that a plurality of combinations of $n_c$ and $n_f$ in which $d_c$ and $d_f$ take values between 0 and 1 may occur. In such cases, a configuration may be adopted in which, for example, the target combination information (Cz, Fz) is specified based on any one combination of $n_c$ and $d_f$ and the adjustment circuit 3A is adjusted to the target combination information (Cz, Fz), before again deriving $d_c$ and $d_f$ and specifying the target combination information (Cz, Fz).

Also, in the case where $d_c$ and $d_f$ do not take values between 0 and 1 in any of the combinations of $n_c$ and $n_f$, a configuration may be adopted in which, for example, the input reflection coefficient $\Gamma in$ is calculated in all combinations of $n_c$ and $n_f$ when $d_c$ and $d_f$ are set to 0, and the target combination information (Cz, Fz) is specified, based on $n_c$ and $n_f$ corresponding to the input reflection coefficient Fin that most closely approximates the target input reflection coefficient $\Gamma in_{set}$.

In the above description, processing for specifying the target combination information (Cz, Fz) is performed after deriving $d_c$ and $d_f$ for all combinations of $n_c$ and $n_f$, but the processing for specifying the target combination information (Cz, Fz) may be performed for a portion of the combinations of $n_c$ and $n_f$. For example, it may be judged whether $d_c$ and $d_f$ take values between 0 and 1 every time $d_c$ and $d_f$ are computed, and if $d_c$ and $d_f$ do take values between 0 and 1, the target combination information (Cz, Fz) may be specified, based on the calculated result of $d_c$ and $d_f$ at that time.

The position information C of the movable portion of the variable capacitor 21 and the output frequency information F of the high frequency power source 1v are included in (associated with) the specified target combination information (Cz, Fz). The reflection coefficient $\Gamma in$ of the input end 301 of the impedance adjustment apparatus 3A can be approximated to the target input reflection coefficient $\Gamma inset$, when the position of the movable portion of the variable capacitor 21 is adjusted to a position corresponding to the position information C associated with target combination information (Cz, Fz), and the output frequency of the high frequency power source 1v is adjusted to a frequency corresponding to the output frequency information F associated with the target combination information (Cz, Fz). That is, the high frequency power source 1v and the load 5 can be approximated to an impedance matching state. Usually, a state where the impedances of the high frequency power source 1v and the load 5 are regarded as being matched can be achieved. For this reason, processing for respectively adjusting the position of the movable portion of the variable capacitor 21 and the output frequency of the high frequency power source 1v to a position corresponding to the position information C and a frequency corresponding to the output frequency information F associated with the target combination information (Cz, Fz) is performed, as shown below.

The target position setting unit 191 sets the position corresponding to the position information Cz of the target combination information (Cz, Fz) specified by the target information specifying unit 180 as the target position $C_{mat}$. The target position $C_{mat}$ is an example of target electrical characteristic information of the present invention. The target position setting unit 191 generates the target position information $C_{mat}$ for adjusting (displacing) the position of the movable portion of the variable capacitor 21 to the target position $C_{mat}$, and outputs the generated target position information $C_{mat}$ to the adjustment unit 30. The target position setting unit 191 outputs the target position information $C_{mat}$ to the adjustment unit 30 as a signal of a form suitable for driving the adjustment unit 30, such as a voltage signal or a pulse signal, for example.

The adjustment unit 30 drives the stepping motor and the like based on the target position information $C_{mat}$, and adjusts (displaces) the position of the movable portion of the variable capacitor 21 to the target position $C_{mat}$.

The target frequency setting unit 192 sets the frequency corresponding to the output frequency information Fz of the target combination information (Cz, Fz) specified by the target information specifying unit 180 as the target output frequency Fac. The target the output frequency $F_{mat}$ is an example of target output frequency information of the present invention. The target frequency setting unit 192 generates the target output frequency information $F_{mat}$ for adjusting (changing) the output frequency of the high frequency power source 1v to the target output frequency $F_{mat}$, and outputs the generated target output frequency information $F_{mat}$ to the high frequency power source 1v. The target frequency setting unit 192 outputs the target output frequency information $F_{mat}$ to the adjustment unit 30 in a form suitable for transmission to the high frequency power source 1v.

The high frequency power source 1v adjusts (changes) the output frequency to the target output frequency $F_{mat}$, based on the target output frequency information $F_{mat}$.

Here, supplementary description of the target output frequency information $F_{mat}$ will be given.

As described above, a difference (error) may occur between the power source recognition output frequency $F_{ge}$ that is recognized by the high frequency power source 1v and the output frequency $F_{now}$ at the current point in time that is detected by the frequency detection unit 120 (output frequency $F_{now}$ at the current point in time that is recognized by the impedance adjustment apparatus 3), due to the manufacturer of the high frequency power source 1v differing from the manufacturer of the impedance adjustment apparatus 3.

In this case, because accurate impedance matching cannot be performed, a frequency obtained by adding the power source recognition output frequency $F_{ge}$ to the difference between the target output frequency $F_{mat}$ and the output frequency $F_{now}$ at the current point in time is set as the target frequency information $F_{mat}$, as shown in Equation 21. Because this results in target output frequency information $F_{mat}$ that takes consideration of the difference (error) between the power source recognition output frequency $F_{ge}$ and the output frequency $F_{now}$ at the current point in time that is recognized by the impedance adjustment apparatus 3 being output to the high frequency power source 1v, accurate impedance matching can be performed, even in the case where a difference (error) arises between the power source recognition output frequency $F_{ge}$ and the output frequency $F_{now}$ at the current point in time.

$$F_{mat}=(f_{mat}-F_{now})+F_{ge} \qquad <\text{Equation 21}>$$

Alternatively, a configuration may be adopted in which the difference between the target output frequency $F_{mat}$ and the output frequency $F_{now}$ at the current point in time is output to the high frequency power source 1v as the target frequency information $F_{mat}$, as in Equation 22, and a frequency obtained by adding the power source recognition output frequency $F_{ge}$ to the target frequency information $F_{mat}$ at the high frequency power source 1v side is output. This enables accurate impedance matching to be performed, even in the case where a difference occurs between the power source recognition output frequency $F_{ge}$ and the output frequency $F_{now}$ at the current point in time.

$$F_{mat}=f_{mat}-F_{now} \qquad <\text{Equation 22}>$$

Note that this invention is not limited to the embodiments described above. For example, the characteristic parameters are not limited to S-parameters or T-parameters. A configuration may be adopted in which Z parameters or Y parameters are used as characteristic parameters, and the abovementioned impedance matching is performed by converting these parameters into the abovementioned T-parameters.

The invention claimed is:

1. An impedance adjustment apparatus that is provided between a high frequency power source and a load, and adjusts a target impedance seen from the high frequency power source to the load, the apparatus comprising:
    an input end for connecting to the high frequency power source;
    an output end for connecting to the load;
    a variable electrical characteristic element;
    a characteristic parameter storage unit for storing a plurality of characteristic parameters indicating transmission characteristics of the impedance adjustment apparatus, the plurality of characteristic parameters being parameters that are respectively acquired for a plurality of adjustment points at which a plurality of frequency adjustment points that correspond to output frequencies of the high frequency power source are combined with a plurality of electrical characteristic adjustment points that correspond to electrical characteristics of the variable electrical characteristic element;
    a high frequency information detection unit for detecting high frequency information of the input end;
    an output frequency acquisition unit for acquiring an output frequency of the high frequency power source;
    an electrical characteristic acquisition unit for acquiring an electrical characteristic of the variable electrical characteristic element;
    a characteristic parameter acquisition unit for acquiring a characteristic parameter for an adjustment point at which the acquired output frequency is combined with the acquired electrical characteristic, based on the plurality of characteristic parameters;
    an output reflection coefficient calculation unit for calculating an output reflection coefficient of the output end, based on the high frequency information detected by the high frequency information detection unit and the characteristic parameter acquired by the characteristic parameter acquisition unit;
    a specifying unit for specifying an impedance adjustment point at which to match the target impedance to the impedance of the high frequency power source, among the plurality of adjustment points, based on the output reflection coefficient, a target input reflection coefficient set in advance, and the plurality of characteristic parameters;
    an electrical characteristic element adjustment unit for adjusting the electrical characteristic of the variable electrical characteristic element to an electrical characteristic of the impedance adjustment point; and
    a command signal output unit for outputting, to the high frequency power source, a command signal for adjusting the output frequency of the high frequency power source to an output frequency of the impedance adjustment point.

2. The impedance adjustment apparatus according to claim 1,
    wherein the characteristic parameter storage unit stores characteristic parameters measured for every adjustment point, or characteristic parameters that are converted from the measured characteristic parameters and are different in type from the measured characteristic parameters.

3. The impedance adjustment apparatus according to claim 2,
wherein the measured characteristic parameters are S-parameters (scattering parameters) and the characteristic parameters that are different in type from the measured characteristic parameters are T-parameters (transmission parameters).

4. The impedance adjustment apparatus according to claim 1,
wherein the plurality of characteristic parameters that are stored in the characteristic parameter storage unit include actual values measured at each adjustment point with respect to a portion of the plurality of adjustment points, and estimated values computed at each adjustment point by interpolation using the actual values with respect to adjustment points that have not been measured among the plurality of adjustment points.

5. The impedance adjustment apparatus according to claim 4,
wherein the adjustment points at which the characteristic parameters were measured are adjustment points at which a portion of frequency adjustment points extracted at a first interval from the plurality of frequency adjustment points are combined with a portion of electrical characteristic adjustment points extracted at a second interval from the plurality of electrical characteristic adjustment points.

6. The impedance adjustment apparatus according to claim 1,
wherein the specifying unit, based on the target input reflection coefficient and the plurality of characteristic parameters, calculates a virtual output reflection coefficient of the output end at each adjustment point assuming that the output frequency of the high frequency power source and the electrical characteristic of the variable electrical characteristic element have been adjusted to the plurality of adjustment points, and specifies an adjustment point at which a difference between the output reflection coefficient and the virtual output reflection coefficient is smallest as an adjustment point of the target impedance.

7. The impedance adjustment apparatus according to claim 1,
wherein the high frequency information is a traveling wave voltage that travels from the high frequency power source to the load and a reflected wave voltage that is reflected from the load to the high frequency power source.

8. The impedance adjustment apparatus according to claim 1,
wherein the output reflection coefficient calculation unit calculates an input reflection coefficient of the input end based on the high frequency information, and calculates the output reflection coefficient based on the calculated input reflection coefficient and the acquired characteristic parameter.

9. The impedance adjustment apparatus according to claim 1, further comprising:
a frequency detection unit for detecting the output frequency of the high frequency power source using the high frequency information.

10. The impedance adjustment apparatus according to claim 1,
wherein the high frequency power source outputs, to the impedance adjustment apparatus, information on an output frequency of a high frequency wave that is output, and
the output frequency acquisition unit acquires the information on the output frequency that is input from the high frequency power source, as the output frequency of the high frequency power source.

* * * * *